(12) United States Patent
Tanaka

(10) Patent No.: US 10,290,680 B2
(45) Date of Patent: May 14, 2019

(54) RERAM MIM STRUCTURE FORMATION

(71) Applicant: SANDISK TECHNOLOGIES LLC, Addison, TX (US)

(72) Inventor: Yoichiro Tanaka, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 60 days.

(21) Appl. No.: 14/928,999

(22) Filed: Oct. 30, 2015

(65) Prior Publication Data

US 2017/0125483 A1   May 4, 2017

(51) Int. Cl.
 *H01L 47/00* (2006.01)
 *H01L 27/24* (2006.01)
 *H01L 45/00* (2006.01)

(52) U.S. Cl.
 CPC ...... *H01L 27/2418* (2013.01); *H01L 27/2454* (2013.01); *H01L 27/2481* (2013.01); *H01L 45/1233* (2013.01); *H01L 45/1253* (2013.01); *H01L 45/145* (2013.01);
 (Continued)

(58) Field of Classification Search
 CPC ............. H01L 27/2418; H01L 45/1233; H01L 45/1253; H01L 45/145; H01L 45/1683; H01L 45/2418; H01L 27/2454; H01L 27/2481
 See application file for complete search history.

(56) References Cited

U.S. PATENT DOCUMENTS 5,751,012 A * 5/1998 Wolstenholme .... H01L 27/1021
 257/2
2004/0232509 A1* 11/2004 Vyvoda ............... H01L 23/5252
 257/473
(Continued)

FOREIGN PATENT DOCUMENTS

WO   WO2016/022304   2/2016

OTHER PUBLICATIONS

PCT International Search Report dated Sep. 9, 2015, PCT Patent Application No. PCT/US2015/031804.
(Continued)

*Primary Examiner* — Samuel A Gebremariam
(74) *Attorney, Agent, or Firm* — Vierra Magen Marcus LLP

(57) ABSTRACT

Methods for improving the operation of a memory array by arranging a Metal-Insulator-Metal (MIM) structure between a word line and an adjustable resistance bit line structure are described. The MIM structure may correspond with a metal/ReRAM material/metal structure that is arranged between the word line and an intrinsic polysilicon region of the adjustable resistance bit line structure. In one example, a word line (e.g., TiN) may be arranged adjacent to a ReRAM material (e.g., HfOx) that is adjacent to a first metal (e.g., TiN) that is adjacent to the intrinsic polysilicon region. The first metal may comprise a metal, metal-nitride, or a metal-silicide. In another example, the word line may be arranged adjacent to a ReRAM material that is adjacent to a first metal (e.g., TiN) that is adjacent to a second metal different from the first metal (e.g., tungsten) that is adjacent to the intrinsic polysilicon region.

17 Claims, 22 Drawing Sheets

(52) U.S. Cl.
    CPC .......... *H01L 45/1683* (2013.01); *H01L 45/08* (2013.01); *H01L 45/1226* (2013.01); *H01L 45/146* (2013.01)

(56) References Cited

U.S. PATENT DOCUMENTS

| | | | |
|---|---|---|---|
| 2006/0148248 A1* | 7/2006 | Brooks | H01L 21/76877 438/654 |
| 2012/0147650 A1* | 6/2012 | Samachisa | G11C 13/0002 365/51 |
| 2012/0261638 A1* | 10/2012 | Sills | H01L 27/2463 257/5 |
| 2013/0229846 A1 | 9/2013 | Chien | |
| 2013/0292630 A1 | 11/2013 | Sasago | |
| 2013/0336037 A1* | 12/2013 | Chen | H01L 27/2454 365/51 |
| 2014/0313813 A1 | 10/2014 | Sonehara | |

OTHER PUBLICATIONS

PCT Written Opinion of the International Searching Authority dated Sep. 9, 2015, PCT Patent Application No. PCT/US2015/031804.
PCT International Search Report and Written Opinion of the International Searching Authority dated Dec. 21, 2016, PCT Patent Application No. PCT/US2016/051593.

\* cited by examiner

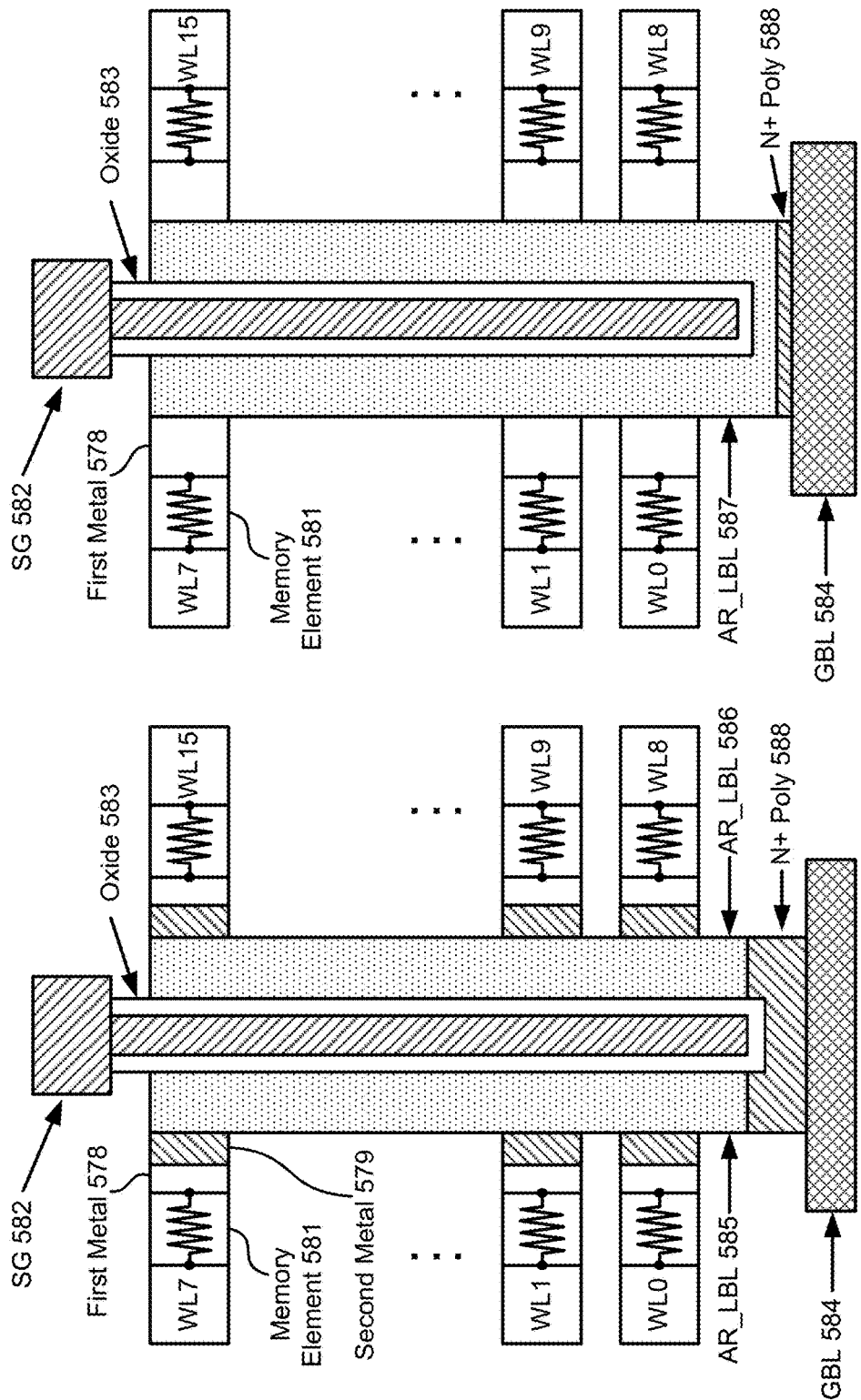

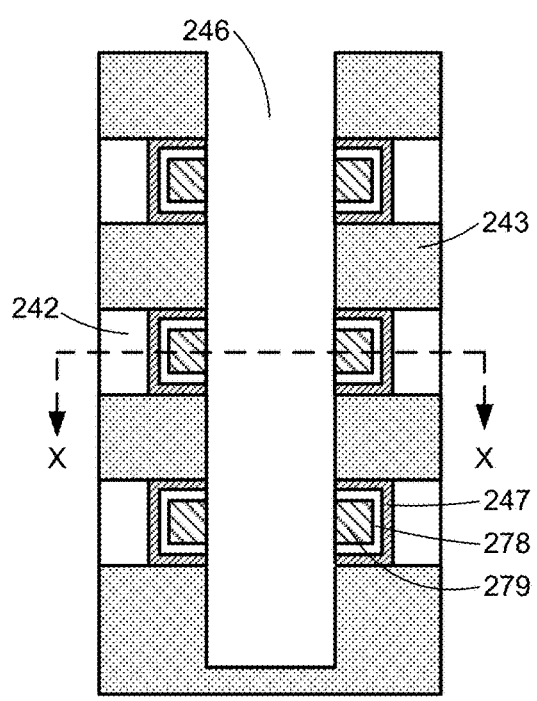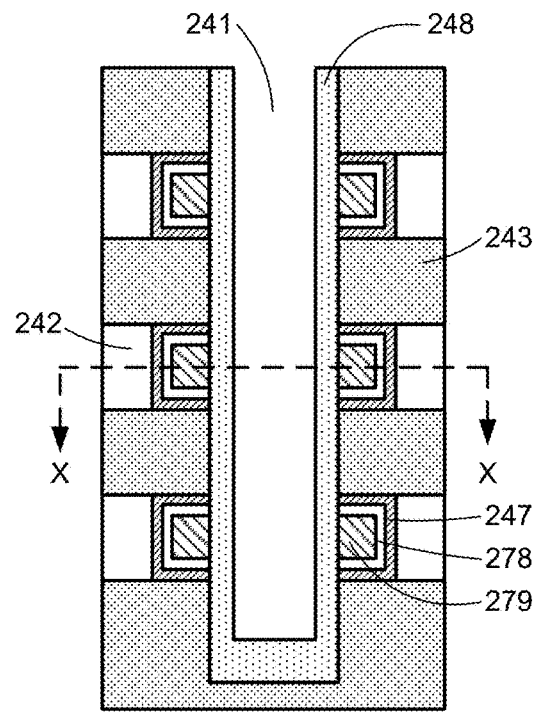
FIG. 7I    FIG. 7K
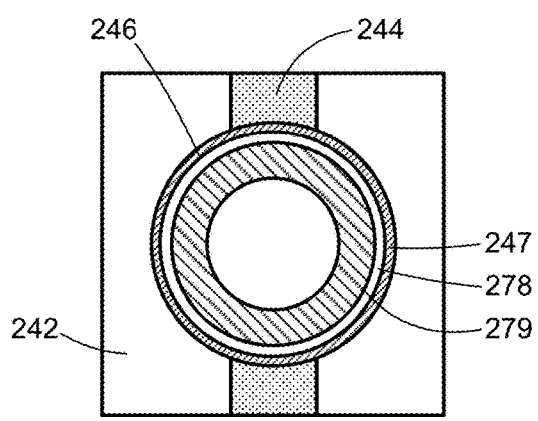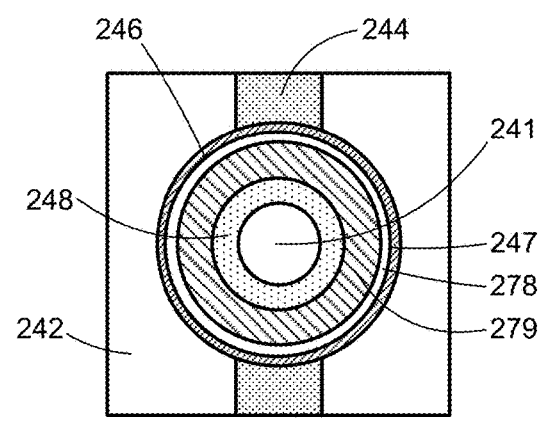
FIG. 7J    FIG. 7L

RERAM MIM STRUCTURE FORMATION

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations and increased leakage currents through unselected memory cells.

BRIEF DESCRIPTION OF THE DRAWINGS

FIGS. 6A-6I depict various embodiments of portions of a memory array.

DETAILED DESCRIPTION

Figure 1A:
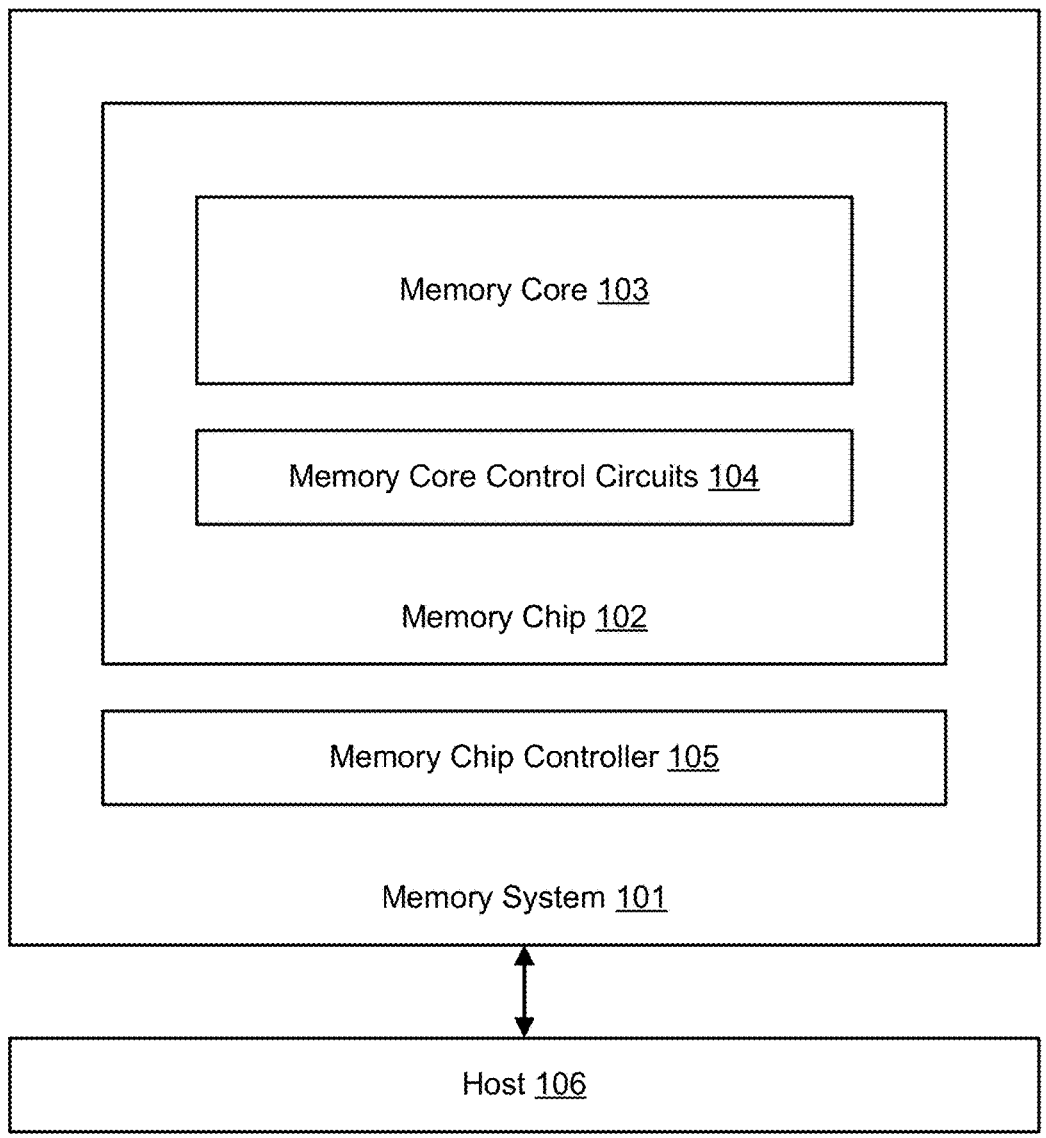
FIGS. 1A-1G depict various embodiments of a memory system.

Technology is described for reducing leakage currents through unselected memory cells (e.g., H-cells and/or U-cells) of a memory array during a memory operation (e.g., a read operation, a programming operation, an erase operation, a program verify operation, or an erase verify operation). In some embodiments, leakage currents through unselected memory cells of the memory array may be reduced by setting an adjustable resistance bit line structure connected to the unselected memory cells into a high resistance state or a non-conducting state. The adjustable resistance bit line structure may comprise a bit line structure in which the resistance of an intrinsic (or near intrinsic) polysilicon portion of the bit line structure may be adjusted via an application of a voltage to a select gate (SG) portion of the bit line structure that is isolated or separated from the intrinsic polysilicon portion (e.g., an oxide layer or a gate dielectric layer may be arranged between the intrinsic polysilicon portion and the select gate portion of the bit line structure). In this case, the intrinsic polysilicon portion may be set into a conducting state or a non-conducting state based on the voltage applied to the select gate portion of the bit line structure. The adjustable resistance bit line structure may comprise a vertical bit line structure (e.g., a bit line structure that is arranged in a direction that is substantially orthogonal to a substrate) or a horizontal bit line structure (e.g., a bit line structure that is arranged in a direction that is substantially parallel to a substrate).

Technology is also described for improving the operation of a memory array that includes adjustable resistance bit line structures by arranging a Metal-Insulator-Metal (MIM) structure between a word line and an adjustable resistance bit line structure. In some embodiments, the MIM structure may correspond with a metal/ReRAM material/metal structure that is arranged between the word line and an intrinsic polysilicon region of the adjustable resistance bit line structure. In one example, a word line (e.g., TiN) may be arranged adjacent to a ReRAM material (e.g., HfOx) that is adjacent to a first metal (e.g., TiN) that is adjacent to the intrinsic polysilicon region of the adjustable resistance bit line structure. The word line may abut the ReRAM material that abuts the first metal that abuts the intrinsic polysilicon region of the adjustable resistance bit line structure. In some cases, the first metal may comprise a metal, metal-nitride, or a metal-silicide. For example, the first metal may comprise TiN, WN, TaN, Ti, Ta, Ru, W, TiSi, CoSi, or NiSi. In another example, the word line may be arranged adjacent to a ReRAM material that is adjacent to a first metal (e.g., TiN) that is adjacent to a second metal different from the first metal (e.g., tungsten) that is adjacent to the intrinsic polysilicon region of the adjustable resistance bit line structure. In these cases, the ReRAM material may be arranged between (or sandwiched between) two metal layers forming an MIM structure.

One benefit of using an MIM structure is that the MIM structure may provide lower power operation and improved endurance for the memory array compared with using a Metal-Insulator-Semiconductor (MIS) structure without a metal between the ReRAM material and the intrinsic polysilicon region of the adjustable resistance bit line structure. One advantage of having a metal insertion between the ReRAM material and the intrinsic polysilicon region of the adjustable resistance bit line structure may be a lower operating voltage by having an ohmic interface or an ohmic contact at the interface of the metal insertion and the intrinsic polysilicon region of the adjustable resistance bit line structure.

In some embodiments, a memory array including a plurality of adjustable resistance bit line structures may be formed by first etching through an alternating stack of word line layers and dielectric layers (e.g., etching through layers of TiN or polysilicon that are separated by oxide layers) to form a plurality of memory holes. The word line layers and the dielectric layers may be arranged in a first direction and the plurality of memory holes may be arranged in a second direction orthogonal to the first direction (e.g., perpendicular to a semiconductor substrate). The plurality of memory holes may comprise rectangular, square, or cylindrical holes. The plurality of memory holes may be created by patterning and then removing material using various etching techniques such as dry etching, wet chemical etching, plasma etching, or reactive-ion etching (RIE). After the plurality of memory holes have been created, portions of the word line layers may be recessed and a conformal layer of ReRAM material may be deposited using chemical vapor deposition (CVD) or atomic layer deposition (ALD). A first metal layer (e.g., TiN) may then be deposited over the layer of ReRAM material. The first metal layer and the layer of ReRAM material may then be etched using anisotropic etching prior to forming vertical pillars within the plurality of memory holes. The word line layers may be recessed using isotropic etching or wet etching.

In some cases, the first metal layer and a second metal layer (e.g., tungsten) may be deposited after the layer of ReRAM material has been deposited within the recessed word line layers. The second metal layer, the first metal layer, and the layer of ReRAM material may then be etched using anisotropic etching prior to forming vertical pillars within the plurality of memory holes. In one example, the vertical pillars may be formed by depositing an intrinsic polysilicon layer, depositing an oxide layer on the intrinsic polysilicon layer, and depositing a polysilicon layer on the oxide layer to form the select gates of the adjustable resistance bit line structures. The layers of the vertical pillars may be deposited using various deposition techniques such as chemical vapor deposition (CVD), physical vapor deposition (PVD), or atomic layer deposition (ALD). At least a portion of the interface between the first metal layer and the intrinsic polysilicon layer may comprise a planar region or at least a portion of the interface between the second metal layer and the intrinsic polysilicon layer may comprise a planar region. In one example, the MIM structures formed between the word line layers and the vertical bit lines may include a first metal layer adjacent to the ReRAM material and a second metal layer arranged between the first metal layer and the intrinsic polysilicon layer of the vertical pillars. The first metal layer may serve as a barrier metal for the second metal layer.

In some cases, an oxidation removal step or a native oxide removal step may be performed prior to depositing the intrinsic polysilicon layer within the plurality of memory holes. The oxidation removal may be performed using in-situ dry cleaning. In one example, a ReRAM material may be deposited within a recessed word line followed by a first metal layer (e.g., TiN) followed by a second metal layer (e.g., tungsten). A dry clean process or other oxidation removal process may then be performed prior to depositing an intrinsic polysilicon layer over the second metal layer.

In one embodiment, a memory array may include a first bit line structure and a second bit line structure. The first bit line structure may be connected to a first set of memory cells that includes a selected memory cell and the second bit line structure may be connected to a set of unselected memory cells. In some cases, the first bit line structure and the second bit line structure may be connected to a global bit line. During a memory operation, the first bit line structure may be set into a first resistance state and the second bit line structure may be set into a second resistance state that is greater than the first resistance state. During the memory operation, the first bit line structure may be set into a conducting state and the second bit line structure may be set into a non-conducting state. In one example, the first set of memory cells may comprise ReRAM memory cells and the memory operation may comprise a programming operation or a read operation. In another example, the first set of memory cells may comprise conductive bridge memory cells or programmable metallization memory cells. In some cases, the first bit line structure may include a first semiconducting body region and a first select gate region that is separated from the first semiconducting body region by a first gate dielectric. The first bit line structure may be set into a conducting state by applying a first voltage to the first select gate region. The second bit line structure may include a second semiconducting body region and a second select gate region that is separated from the second semiconducting body region by a second gate dielectric. The second bit line structure may be set into a non-conducting state by applying a second voltage different from the first voltage to the second select gate region.

In some embodiments, a bit line structure may include a distributed FET structure. The distributed FET structure may comprise a distributed NMOS FET structure or a distributed PMOS FET structure. In some cases, the distributed FET structure may not include defined drain junctions. With the distributed NMOS FET structure, the semiconducting body region of the bit line structure may comprise undoped polycrystalline silicon (or polysilicon), undoped silicon germanium, or undoped indium gallium arsenide. In one embodiment, the carrier concentration of the polycrystalline silicon may be less than $10^{15}$ carriers/cm$^3$ at 25 C or may be about $10^{15}$ carriers/cm$^3$ at 25 C or at room temperature. In another embodiment, the carrier concentration of the polycrystalline silicon may be less than $10^{17}$ carriers/cm$^3$ at 25 C or may be about $10^{47}$ carriers/cm$^3$ at 25 C or at room temperature. In these cases, a voltage may be applied to the select gate region of the bit line structure to increase the carrier concentration in the semiconducting body region and to set the distributed NMOS FET structure into a conducting state. With the distributed PMOS FET structure, the semiconducting body region of the bit line structure may comprise heavily doped polycrystalline silicon (e.g., creating a pinch-off FET or causing the bit line structure to include a pinch-off FET). The carrier concentration of the heavily doped polycrystalline silicon may be greater than $10^{20}$ carriers/cm$^3$ at 25 C or may be about $10^{20}$ carriers/cm$^3$ at 25 C or at room temperature. In this case, a voltage may be applied to the select gate region of the bit line structure to reduce the carrier concentration in the semiconducting body region and to set the distributed PMOS FET structure into a non-conducting state. Thus, a bit line structure may include an intrinsic or undoped semiconducting body region whose resistance may be reduced through the application of a voltage to the select gate region or a bit line structure may include a heavily doped semiconducting body region whose resistance may be increased through the application of a voltage to the select gate region.

One issue with having a bit line with high resistance is that sensing margins may be reduced due to the variability in voltage drops along the high resistance bit line during sensing operations. Moreover, a high resistance bit line may cause an increase in the programming voltages required to program a memory cell during programming operations. Thus, using bit lines with high resistance is typically not advisable.

One benefit of using adjustable resistance bit lines or adjustable resistance bit line structures is that leakage currents through unselected memory cells (e.g., H-cells and/or U-cells) may be significantly reduced. The reduction in leakage currents may allow for improved memory array efficiency and for larger memory array sizes. Furthermore, the reduction in leakage currents during memory operations may lead to reduced power consumption, reduced energy consumption, improved memory reliability, and/or reduced voltages required to bias a memory array during the memory operations.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
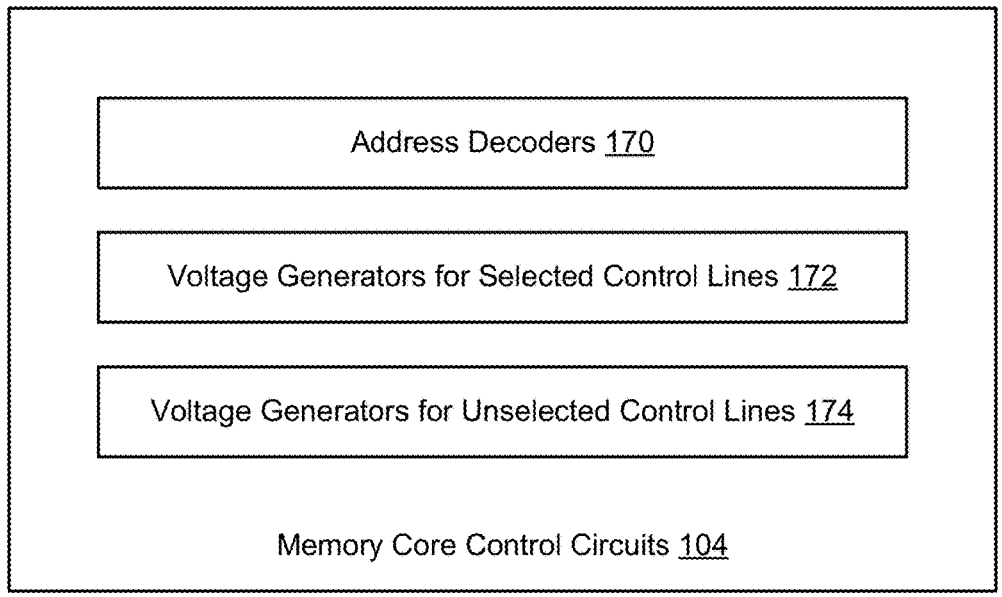

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
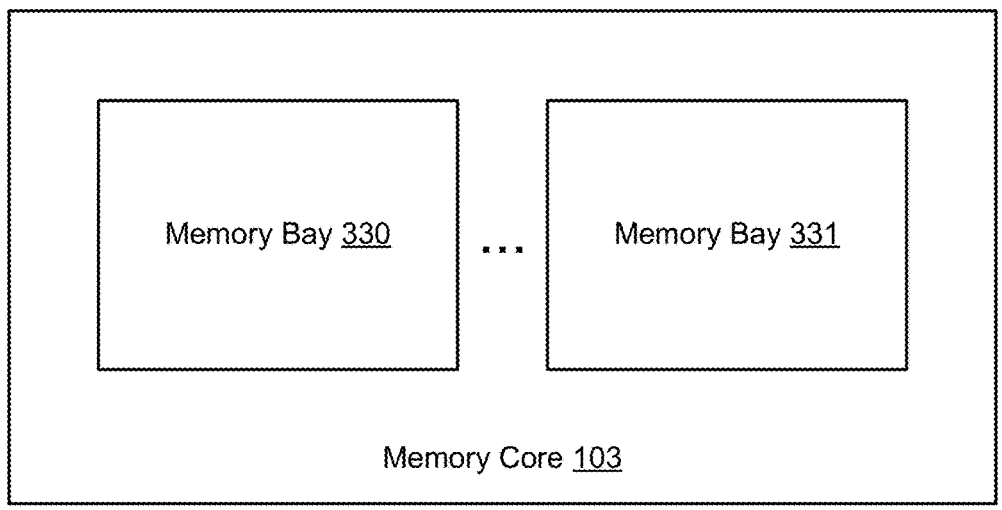

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
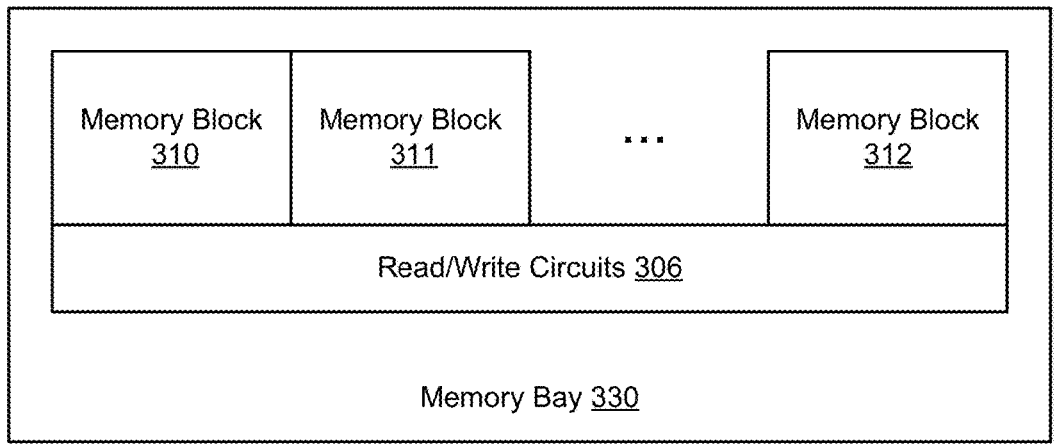

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
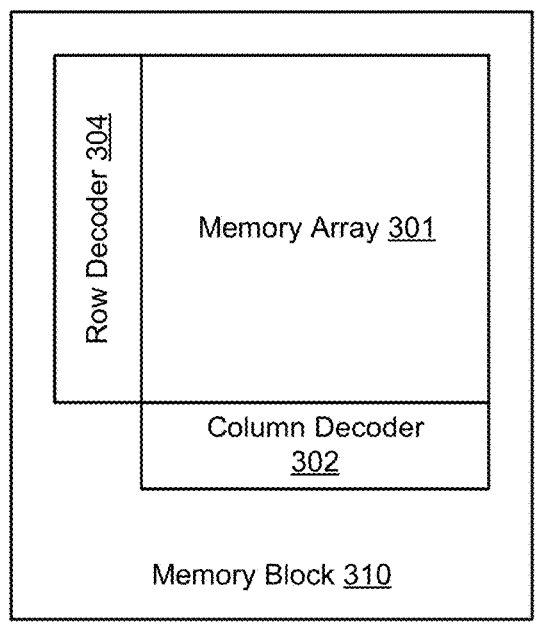

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
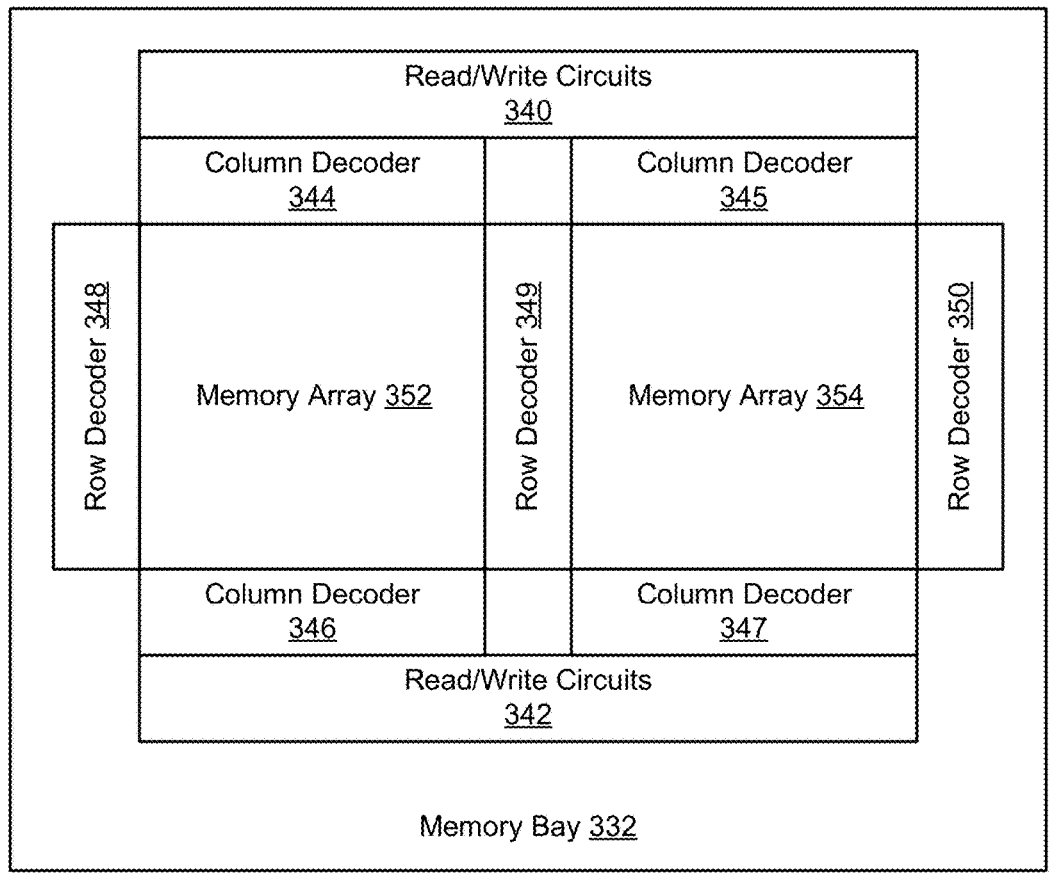

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 1G:
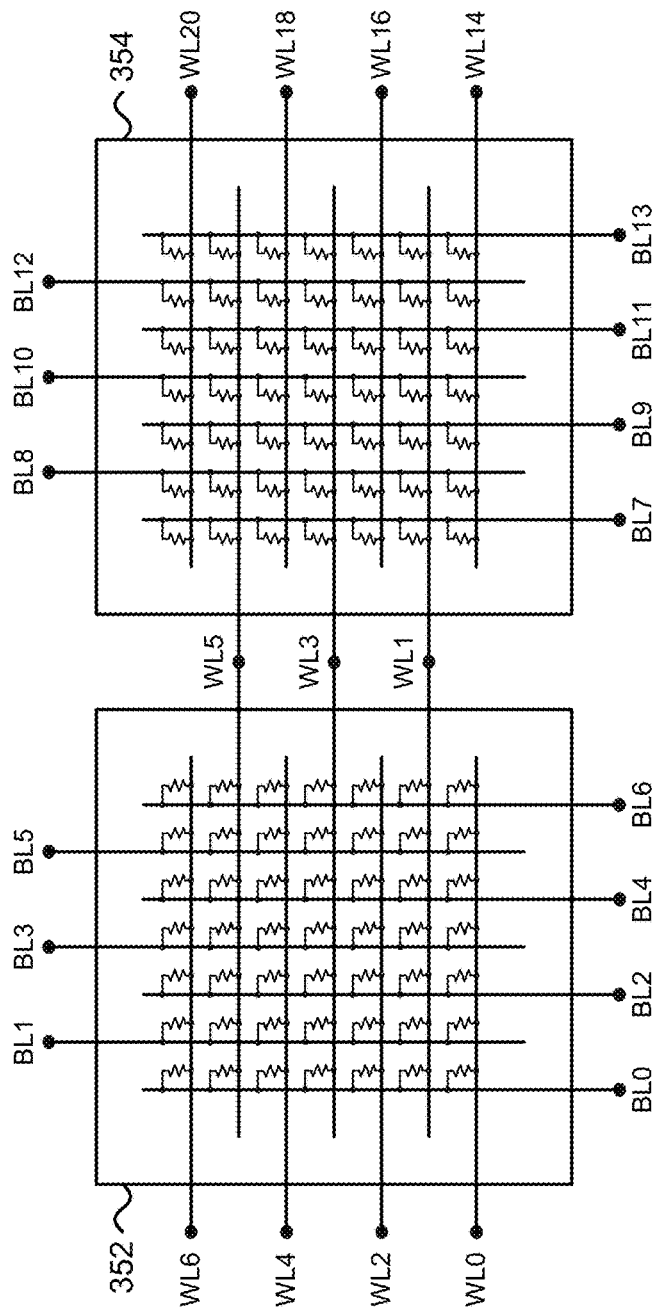

FIG. 1G depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2A:
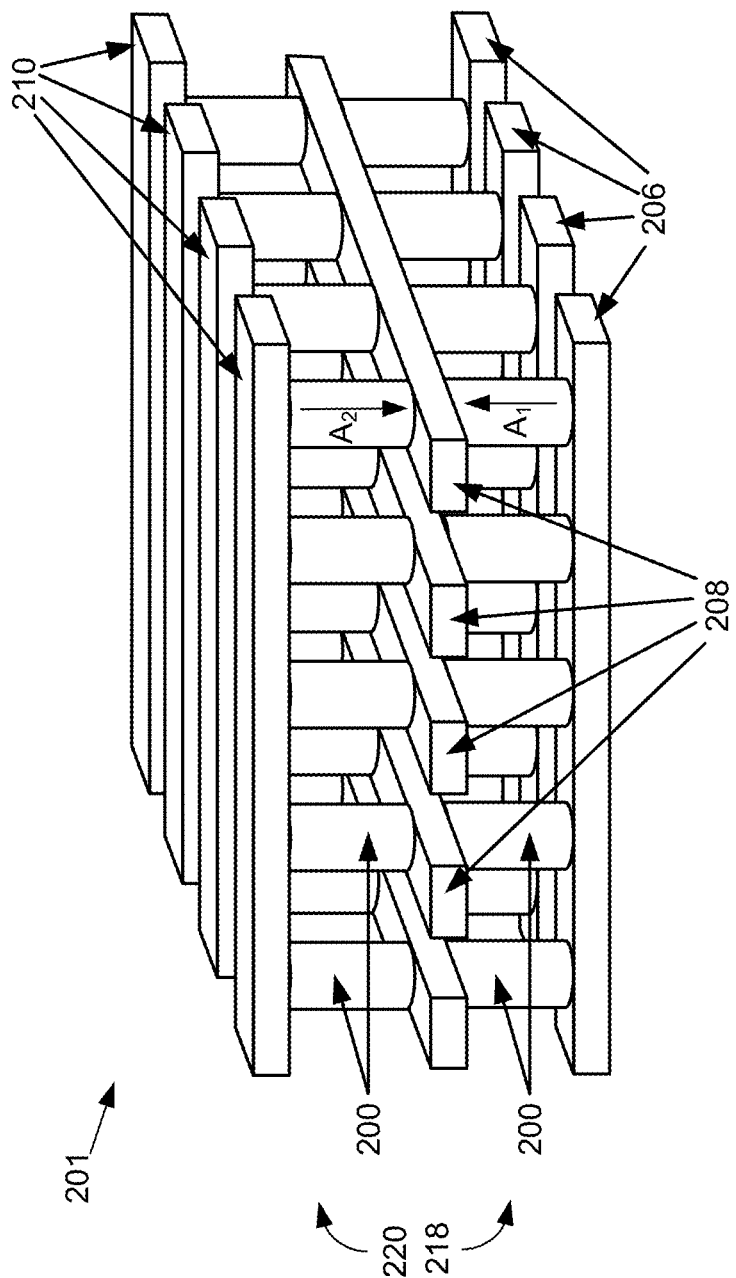
FIGS. 2A-2B depict various embodiments of a portion of a three-dimensional memory array.

FIG. 2A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
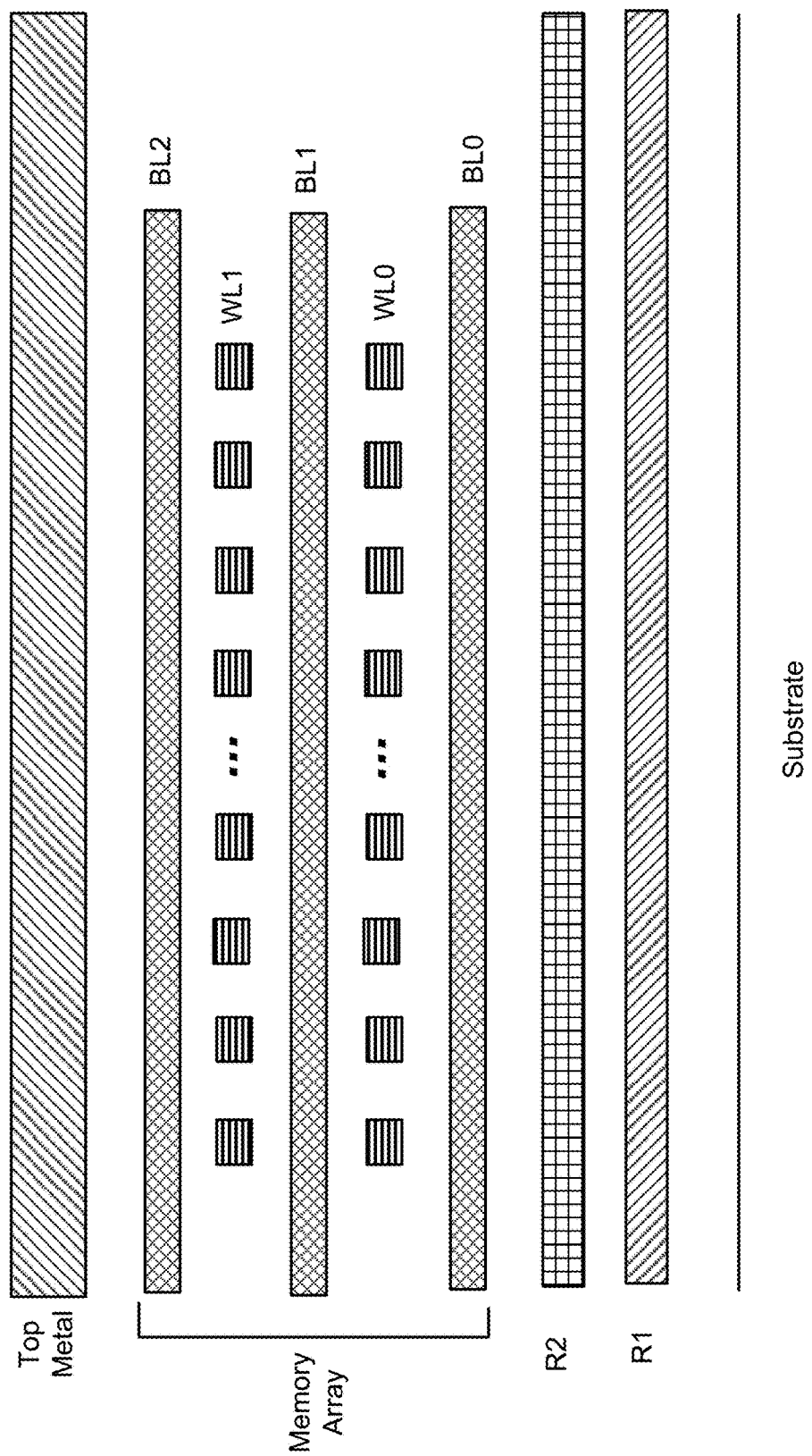

FIG. 2B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3A:
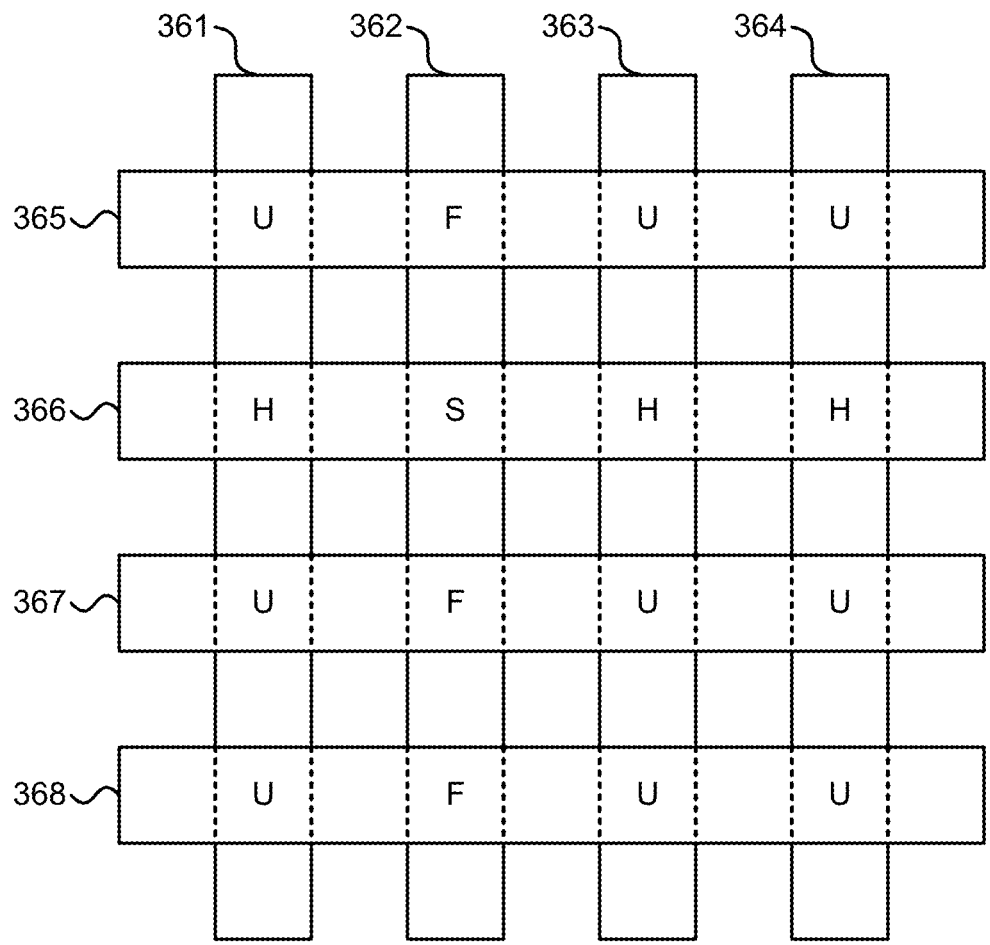
FIGS. 3A-3B depict embodiments of a cross-point memory array.

FIG. 3A depicts one embodiment of a cross-point memory array 360. In one example, the cross-point memory array 360 may correspond with memory array 201 in FIG. 2A. As depicted, cross-point memory array 360 includes word lines 365-368 and bit lines 361-364. The bit lines 361 may comprise vertical bit lines or horizontal bit lines. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3B:
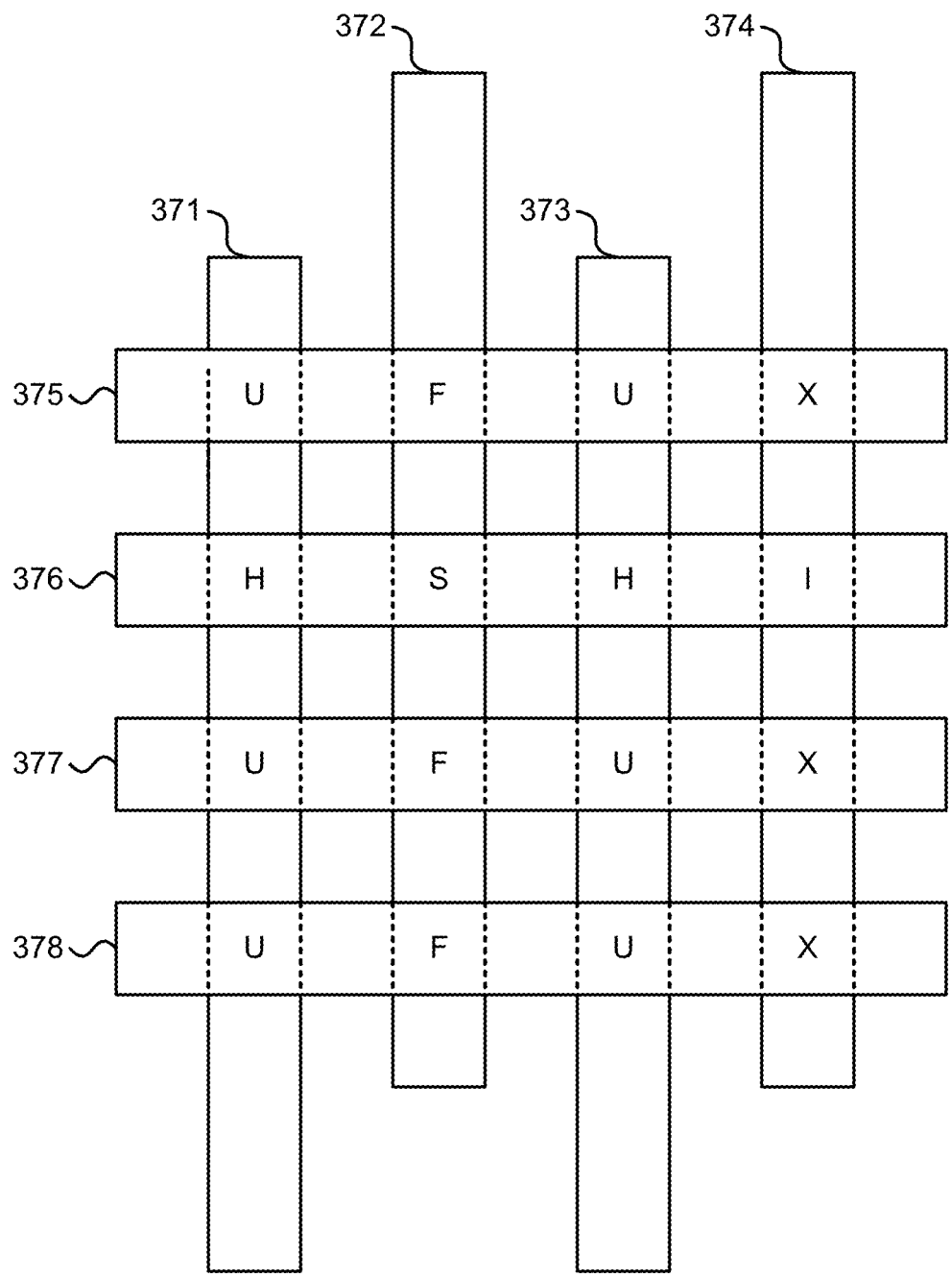

FIG. 3B depicts an alternative embodiment of a cross-point memory array 370. In one example, the cross-point memory array 370 may correspond with memory array 201 in FIG. 2A. As depicted, cross-point memory array 370 includes word lines 375-378 and bit lines 371-374. The bit lines 361 may comprise vertical bit lines or horizontal bit lines. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines.

Figure 4A:
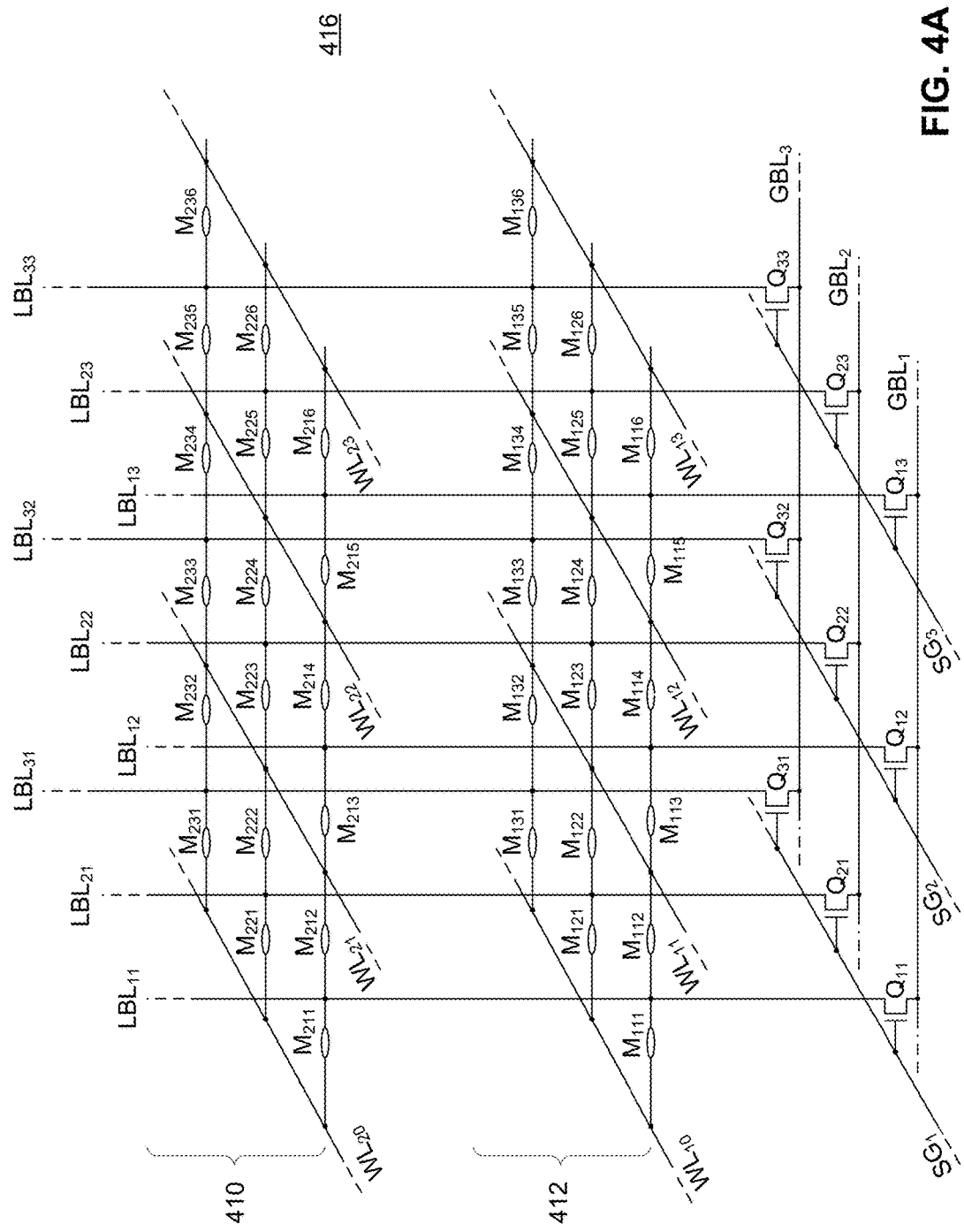
FIGS. 4A-4B depict various embodiments of a portion of a three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
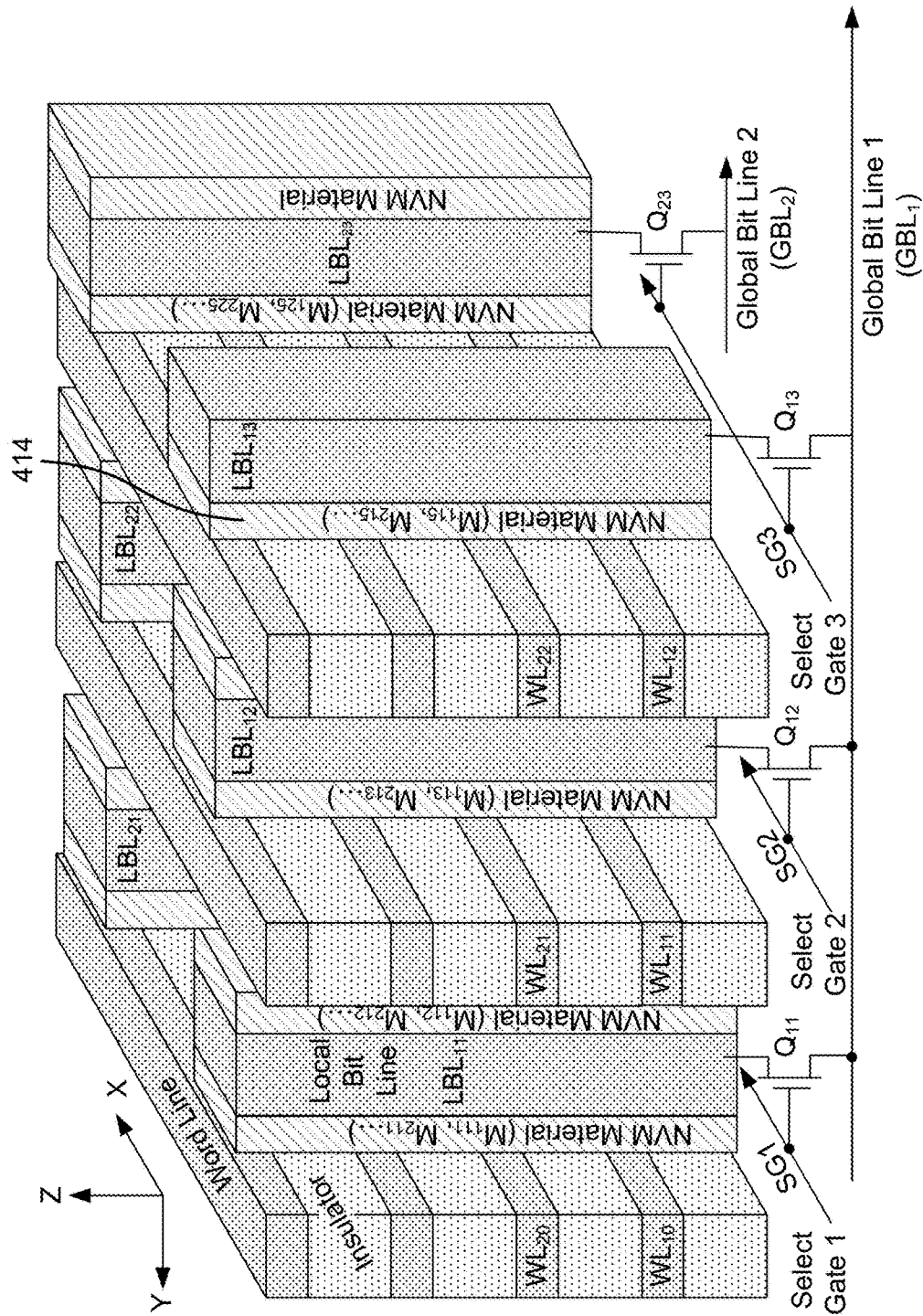

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
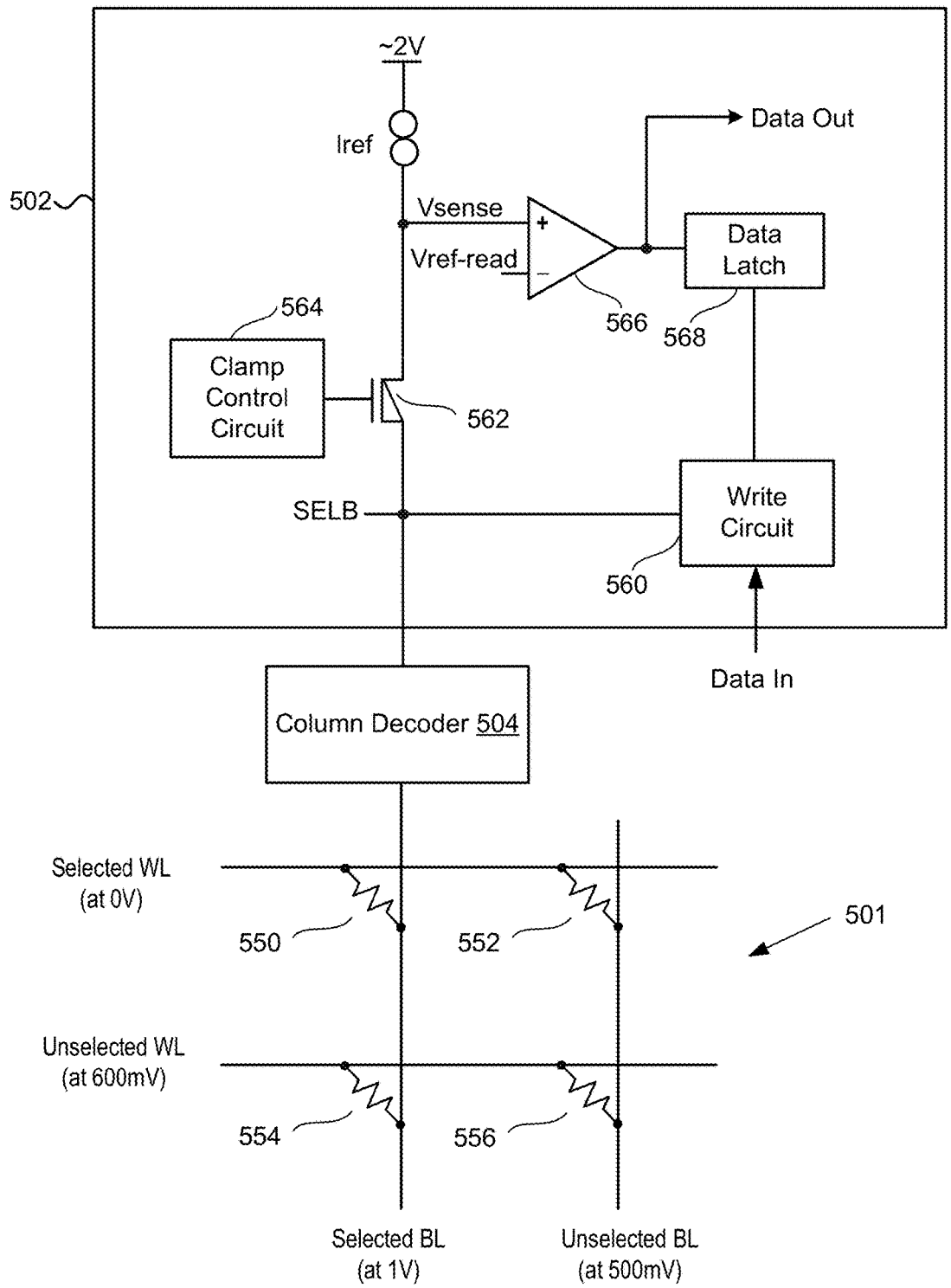
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects)

node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

FIG. 6A depicts one embodiment of a portion of a memory array that includes an adjustable resistance bit line structure. As depicted, the adjustable resistance bit line structure may comprise a vertical bit line structure that includes an adjustable resistance local bit line AR_LBL 585 that is arranged in a direction that is substantially orthogonal to a substrate (e.g., the adjustable resistance local bit line AR_LBL 585 may comprise part of a vertical pillar that is orthogonal to a silicon substrate). The adjustable resistance local bit line AR_LBL 585 may comprise intrinsic (or near intrinsic) polysilicon. The adjustable resistance bit line structure also includes a select gate SG 582 and an oxide layer Oxide 583 or other dielectric layer (e.g., a high-k dielectric layer) that is arranged between the adjustable resistance local bit line AR_LBL 585 and the select gate SG 582. The oxide layer Oxide 583 is also arranged between the adjustable resistance local bit line AR_LBL 586 and the select gate SG 582. Both the adjustable resistance local bit line AR_LBL 585 and the adjustable resistance local bit line AR_LBL 586 extend to the N+ polysilicon layer 588 that may be formed over or abut the global bit line GBL 584. In some cases, the select gate SG 582 and the oxide layer Oxide 583 may extend into the N+ polysilicon layer 588 such that the bottom of the select gate SG 582 is below the top of the N+ polysilicon layer 588. The select gate SG 582 may comprise titanium nitride (TiN) or polysilicon. The adjustable resistance local bit line AR_LBL 585 and the adjustable resistance local bit line AR_LBL 586 may comprise undoped polysilicon or lightly doped N− polysilicon. The Oxide layer 583 may comprise silicon dioxide. The global bit line GBL 584 may comprise TiN or tungsten. In cases where the global bit line GBL 584 comprises tungsten, a layer of TiN may be arranged between the global bit line GBL 584 and the N+ polysilicon layer 588.

In some cases, the adjustable resistance bit line structure may comprise a vertical pillar. The vertical pillar may comprise a rectangular pillar or a cylindrical pillar. The vertical pillar may be formed by etching through a stack of alternating word line layers and oxide layers (e.g., etching through layers of TiN or polysilicon that are separated by oxide layers) to form a rectangular, square, or cylindrical trench (or hole) and then depositing the layers for forming the vertical pillar within the trench. In one example, the vertical pillar may be formed by depositing an intrinsic polysilicon layer, depositing an oxide layer adjacent to the intrinsic polysilicon layer, and depositing a polysilicon layer adjacent to the oxide layer to form the select gate that extends through at least a portion of the vertical pillar.

In one embodiment, the resistance or the conductivity of the adjustable resistance local bit line AR_LBL 585 may be adjusted via an application of a voltage to the select gate SG 582. In one example, the adjustable resistance local bit line AR_LBL 585 may be set into either a conducting state or a non-conducting state based on the voltage applied to the select gate SG 582. When the adjustable resistance local bit line AR_LBL 585 is set into a conducting state, then a low resistance path (e.g., less than 100 ohm or less than 1 Kohm) or a conducting path may be formed between the memory elements connected to the word lines WL0-WL7 and the global bit line GBL 584. When the adjustable resistance local bit line AR_LBL 585 is set into a non-conducting state, then a high resistance path (e.g., more than 1 Gohm or more than 10 Gohm) is placed between the memory elements connected to the word lines WL0-WL7 and the global bit line GBL 584. In effect, the high resistance path may cause the memory elements corresponding with the word lines WL0-WL7 to be electrically disconnected from the global bit line GBL 584. Furthermore, each memory element of the memory elements corresponding with the word lines WL0-WL7 may be electrically disconnected from the other memory elements (e.g., memory element 581 connected to word line WL7 may be electrically disconnected from the other memory elements connected to word lines WL6-WL0). Therefore, in the case that the adjustable resistance local bit line AR_LBL 585 has been set into a non-conducting state and word line WL7 comprises a selected word line that has been set to a selected word line voltage, then the leakage currents (e.g., H-cell leakage currents) from word line WL7 to the other word lines WL6-WL0 via the memory elements connected to the adjustable resistance local bit line AR_LBL 585 may be significantly reduced or eliminated.

Referring to FIG. 6A, word lines WL0-WL7 are arranged on a first side of the vertical bit line structure and word lines WL8-WL15 are arranged on a second side of the vertical bit line structure. The word lines may comprise TiN, polysilicon, or tungsten (W). The word lines may be isolated from each other using an oxide layer not depicted that is arranged between the word line layers. A first set of memory elements including memory element 581 is arranged between the word lines WL0-WL7 and the adjustable resistance local bit line AR_LBL 585. Between each memory element of the first set of elements and the adjustable resistance local bit line AR_LBL 585 is one or more metal layers, such as first metal 578 and second metal 579 that are arranged between memory element 581 and the adjustable resistance local bit line AR_LBL 585. In one example, the first metal 578 may comprise TiN and the second metal 579 may comprise tungsten. In some cases, the one or more metal layers between memory element 581 and the adjustable resistance local bit line AR_LBL 585 may only comprise the first metal 578, with the memory element 581 directly abutting the first metal 578 and the first metal 578 directly abutting the adjustable resistance local bit line AR_LBL 585. A second set of memory elements is arranged between the word lines WL8-WL15 and the adjustable resistance local bit line AR_LBL 586. The memory element 581 may comprise a reversible resistance-switching element. As examples, the memory element 581 may include a ReRAM material, a metal oxide, nickel oxide, hafnium oxide, aluminum oxide, tantalum oxide, a phase change material, or a chalcogenide material.

In one embodiment, the word lines WL0-WL15 may extend into the page while the global bit line GBL 584 may extend horizontally from left to right. The word lines WL0-WL15 may comprise lines that extend in a first direction (e.g., the X direction) and the global bit line GBL 584 may comprise a line that extends in a second direction (e.g., the Y direction) that is orthogonal to the first direction. The vertical bit line structure may extend in a third direction (e.g., the Z direction) that is orthogonal to both the first direction and the second direction.

FIG. 6B depicts another embodiment of a portion of a memory array that includes an adjustable resistance bit line structure. As depicted, the adjustable resistance bit line structure is similar to the adjustable resistance bit line structure depicted in FIG. 6A except that the Oxide layer 583 does not extend to and abut the N+ polysilicon layer 588. As depicted, the Oxide layer 583 does not share a common boundary with the N+ polysilicon layer 588. Moreover, as depicted, the one or more metal layers arranged between memory element 581 and the adjustable resistance local bit line AR_LBL 585 comprises a first metal 578 (e.g., TiN). In some cases, the one or more metal layers arranged between memory element 581 and the adjustable resistance local bit line AR_LBL 585 may comprise two or more different metals.

In one embodiment, the resistance or the conductivity of the adjustable resistance local bit line AR_LBL 587 may be adjusted via an application of a voltage to the select gate SG 582. In one example, the adjustable resistance local bit line AR_LBL 587 may be set into a conducting state or a non-conducting state based on the voltage applied to the select gate SG 582. When the adjustable resistance local bit line AR_LBL 587 is set into a conducting state, then a low resistance path or a conducting path may be formed between the memory elements corresponding with the word lines WL0-WL15 and the global bit line GBL 584. When the adjustable resistance local bit line AR_LBL 587 is set into a non-conducting state, then a high resistance path is placed between the memory elements corresponding with the word lines WL0-WL15 and the global bit line GBL 584. In effect, the high resistance path may cause the memory elements corresponding with the word lines WL0-WL15 to be electrically disconnected from the global bit line GBL 584.

Figure 6C:
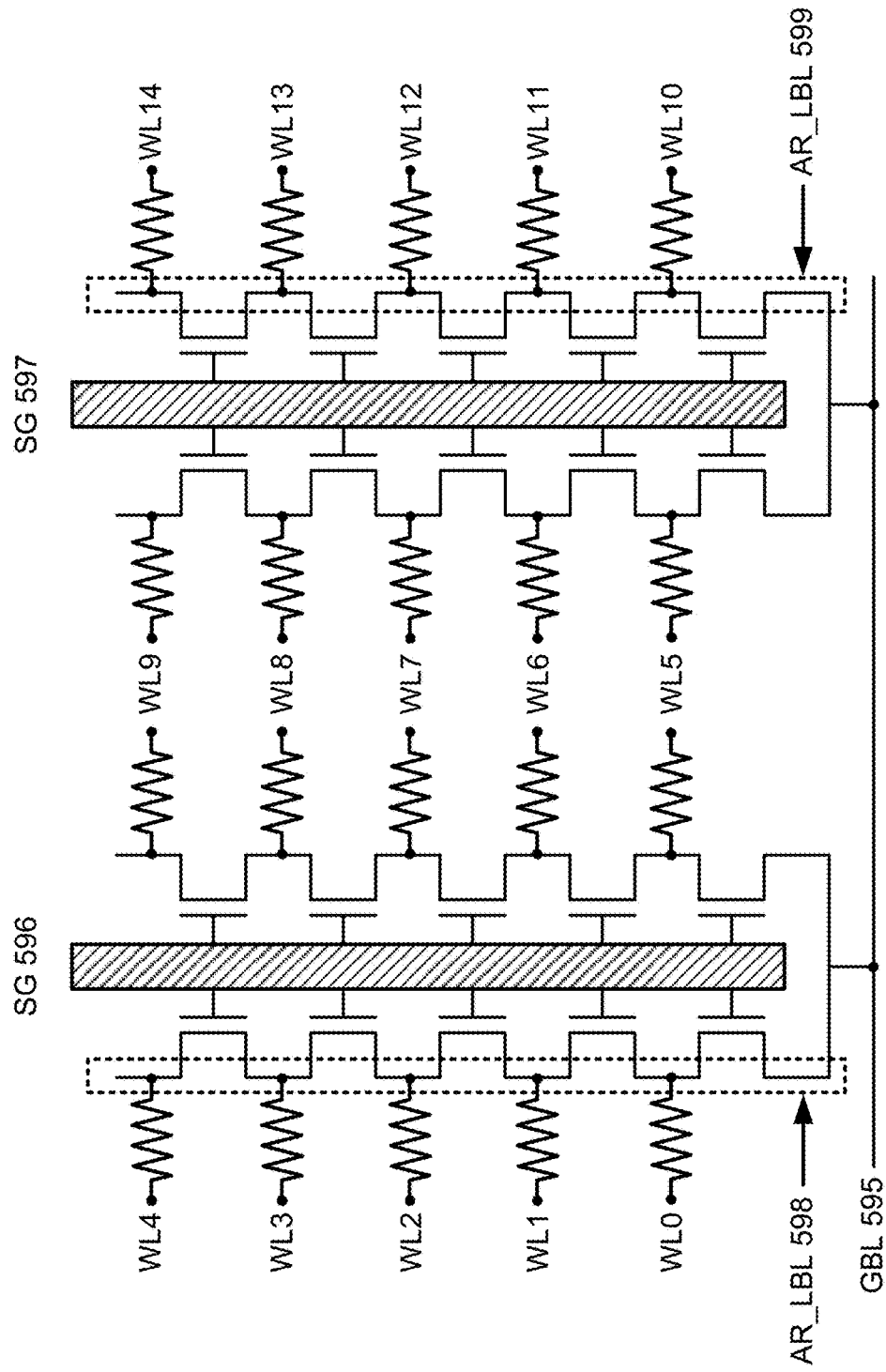

FIG. 6C depicts one embodiment of a first adjustable resistance bit line structure and a second adjustable resistance bit line structure. The first adjustable resistance bit line structure includes a select gate SG 596 and an adjustable resistance local bit line AR_LBL 598. The second adjustable resistance bit line structure includes a select gate SG 597 and an adjustable resistance local bit line AR_LBL 599. The adjustable resistance local bit line AR_LBL 598 and the adjustable resistance local bit line AR_LBL 599 are connected to the global bit line GBL 595 (e.g., via an N+ polysilicon layer).

In some embodiments, the first adjustable resistance bit line structure may comprise a first distributed FET structure and the second adjustable resistance bit line structure may comprise a second distributed FET structure. The first adjustable resistance bit line structure may be set into a conducting state by applying a first voltage to the select gate SG 596 and the second adjustable resistance bit line structure may be set into a non-conducting state by applying a second voltage different from the first voltage to the select gate SG 597. In the case that the first distributed FET structure comprises a distributed NMOS FET structure, then a positive voltage (e.g., 2V-7V) may be applied to the select gate SG 596. The positive voltage applied to the select gate SG 596 may depend on the type of memory operation being performed (e.g., a RESET operation, a SET operation, or a read operation). The positive voltage applied to the select gate SG 596 may be higher during a RESET operation compared with during a SET operation. The positive voltage applied to the select gate SG 596 may be higher during a SET operation compared with during a read operation. The second adjustable resistance bit line structure may be set into a non-conducting state by applying 0V or a negative voltage (e.g., −2V) to the select gate SG 597.

In one embodiment, the first adjustable resistance bit line structure may be connected to a first set of memory cells that includes memory elements that are connected to word lines WL0-WL4 and the second adjustable resistance bit line structure may be connected to a second set of memory cells that includes memory elements that are connected to word lines WL10-WL14. During a memory operation (e.g., a read operation, a programming operation, an erase operation, a program verify operation, or an erase verify operation), the first adjustable resistance bit line structure may be set into a conducting state such that a conducting path exists between the memory elements that are connected to word lines WL0-WL4 and the global bit line GBL 595 and the second adjustable resistance bit line structure may be set into a non-conducting state such that a conducting path does not exist between the memory elements that are connected to word lines WL10-WL14 and the global bit line GBL 595. In this case, the memory elements that are connected to word lines WL10-WL14 are electrically disconnected from the global bit line GBL 595.

Figure 6D:
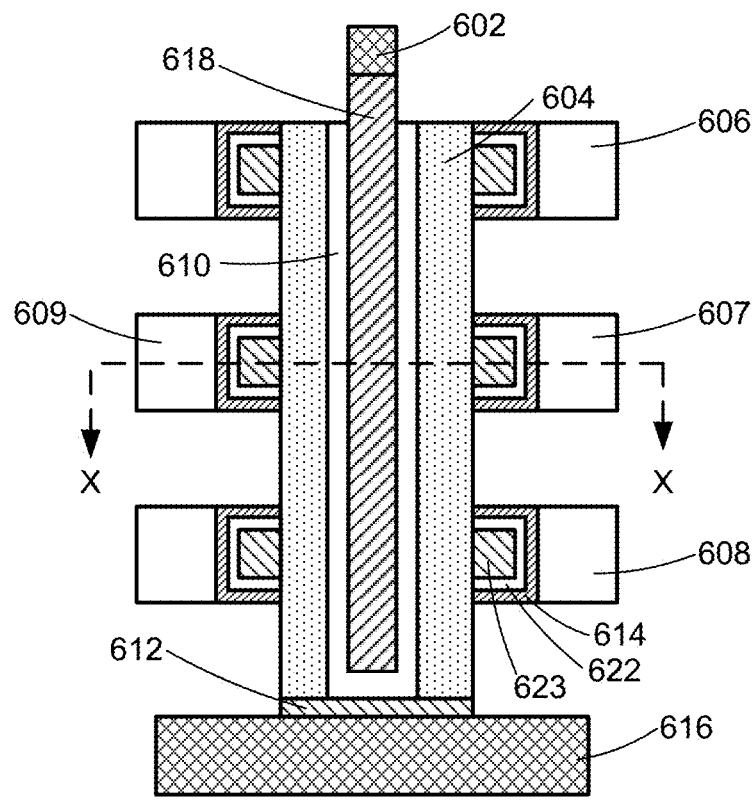

FIG. 6D depicts one embodiment of a portion of a memory array that includes an adjustable resistance bit line structure using a cross-sectional view in the global bit line direction. The structure depicted in FIG. 6D is one example of an implementation of the structure depicted in FIG. 6A. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise intrinsic or undoped polysilicon. In some cases, the adjustable resistance local bit line 604 may comprise lightly doped N-polysilicon. In other cases, the adjustable resistance local bit line 604 may comprise undoped silicon germanium. The dielectric layer 610 may comprise an oxide layer. The select gate 618 may comprise TiN or polysilicon. An SG line 602 connects to the select gate 618. The SG line 602 may comprise TiN, polysilicon, or tungsten. In some cases, the SG line 602 may extend in the word line direction (e.g., into the page). In other cases, the SG line 602 may extend in the global bit line direction (e.g., horizontally from left to right on the page). A ReRAM layer 614 is arranged between a first word line 608 and a layer of first metal 622. The layer of first metal 622 is arranged between the ReRAM layer 614 and a layer of second metal 623. The layer of second metal 623 is arranged between the layer of first metal 622 and the adjustable resistance local bit line 604. The layer of first metal 622 may comprise TiN and the layer of second metal 623 may comprise tungsten. The ReRAM layer 614 may comprise a phase change material, a ferroelectric material, or a metal oxide such as nickel oxide or hafnium oxide. The adjustable resistance local bit line 604 may connect to a global bit line 616 via an N+ polysilicon layer 612. The global bit line 616 may comprise TiN or tungsten. In one embodiment, FIG. 6D may depict a cross-sectional view taken along line Z-Z of FIG. 6E.

Figure 6E:
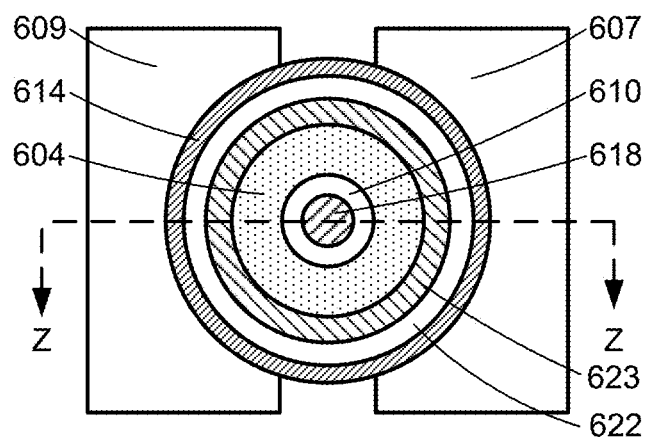

FIG. 6E depicts one embodiment of a cross-sectional view taken along line X-X of FIG. 6D. In one example, the cross-sectional view taken along line X-X of FIG. 6D may comprise a horizontal slice taken through a word line layer that includes word lines 607 and 609.

Figure 6F:
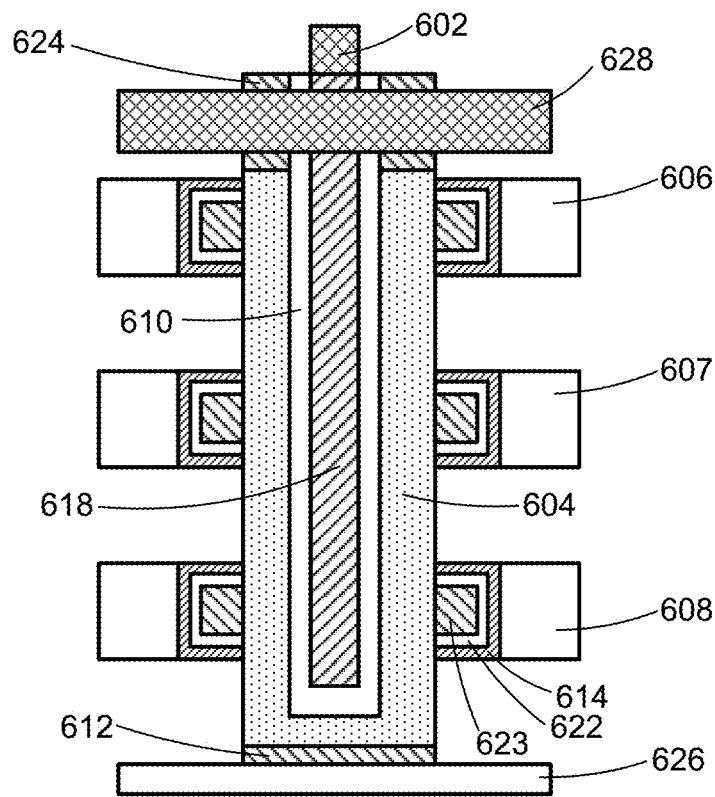

FIG. 6F depicts another embodiment of a portion of a memory array that includes an adjustable resistance bit line structure. The adjustable resistance bit line structure may connect to a global bit line, such as global bit line 628, near the top of the adjustable resistance bit line structure or above the highest word line layer. As depicted, the SG line 602 directly connects to the select gate 618. Thus, in some cases, an SG line may directly connect to or abut a select gate. In other cases, an SG line may selectively connect to the select gate via a vertical TFT or other transistor. One benefit of not using a vertical TFT to selectively connect the SG line to the select gate is that process complexity and manufacturing costs may be reduced.

Figure 6G:
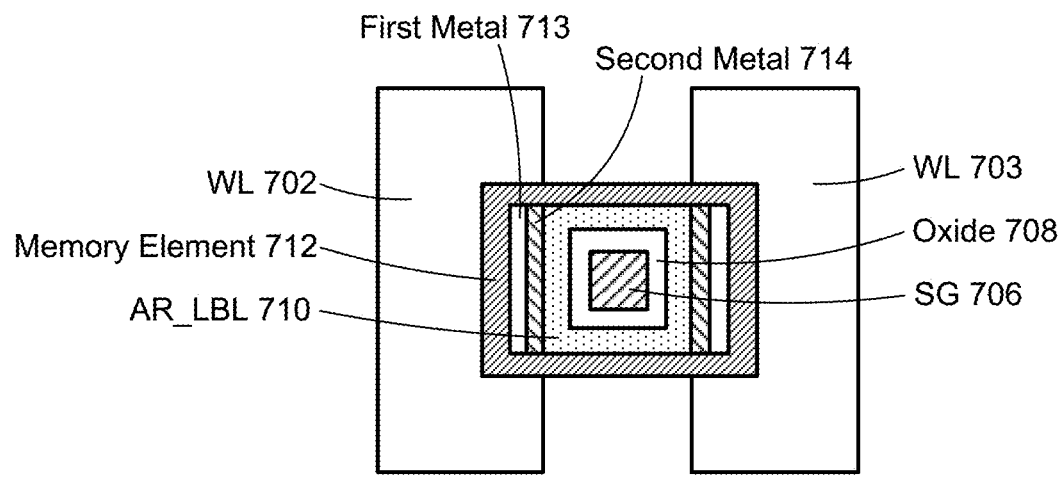

FIG. 6G depicts one embodiment of a top plan view of an adjustable resistance bit line structure. The adjustable resistance bit line structure may be formed using a vertical pillar that includes a select gate SG 706 that is surrounded by an oxide layer Oxide 708 that is surrounded by an adjustable resistance local bit line AR_LBL 710. A layer of second metal 714 may abut or directly connect the adjustable resistance local bit line AR_LBL 710. A layer of first metal 713 may abut or directly connect the layer of second metal 714. The memory element layer 712 may abut or directly connect the layer of first metal 713. A first side of the vertical pillar may contact a first word line WL 702 and a second side of the vertical pillar may contact a second word line WL 703. In some cases, the word line spacing between word line WL 702 and word line WL 703 may comprise 48 nm or 24 nm.

Figure 6H:
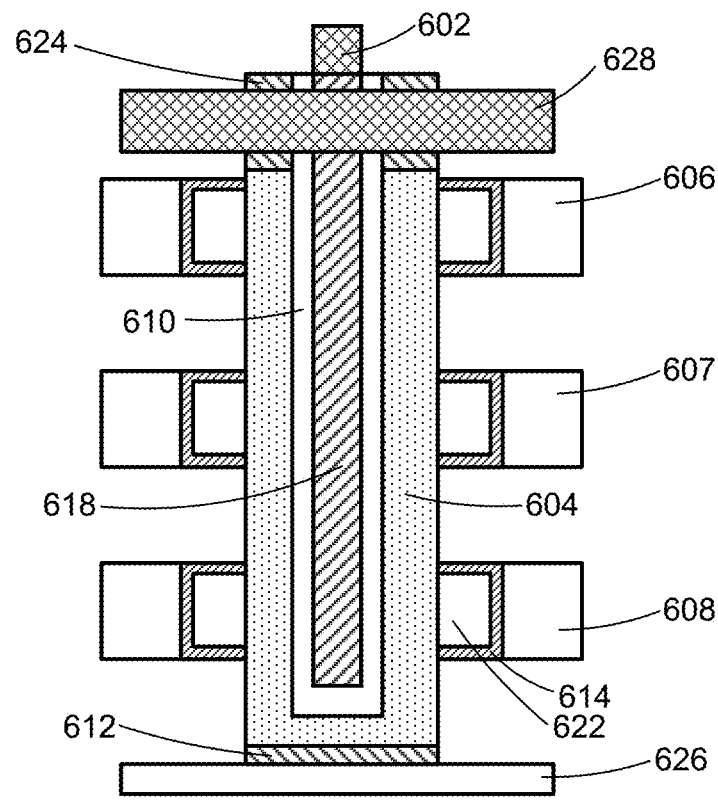

FIG. 6H depicts one embodiment of a portion of a memory array similar to FIG. 6F, but with only a single metal layer or region between the word lines and the adjustable resistance local bit line. The adjustable resistance bit line structure may connect to a global bit line, such as global bit line 628, near the top of the adjustable resistance bit line structure or above the highest word line layer. As depicted, a ReRAM layer 614 is arranged between a first word line 608 and a layer of first metal 622. The layer of first metal 622 is arranged between the ReRAM layer 614 and the adjustable resistance local bit line 604. The layer of first metal 622 may comprise TiN. The ReRAM layer 614 may directly abut the first word line 608 on a first side of the ReRAM layer 614 and directly abut the layer of first metal 622 on a second side of the ReRAM layer 614. The layer of first metal 622 may directly abut or contact the adjustable resistance local bit line 604.

Figure 6I:
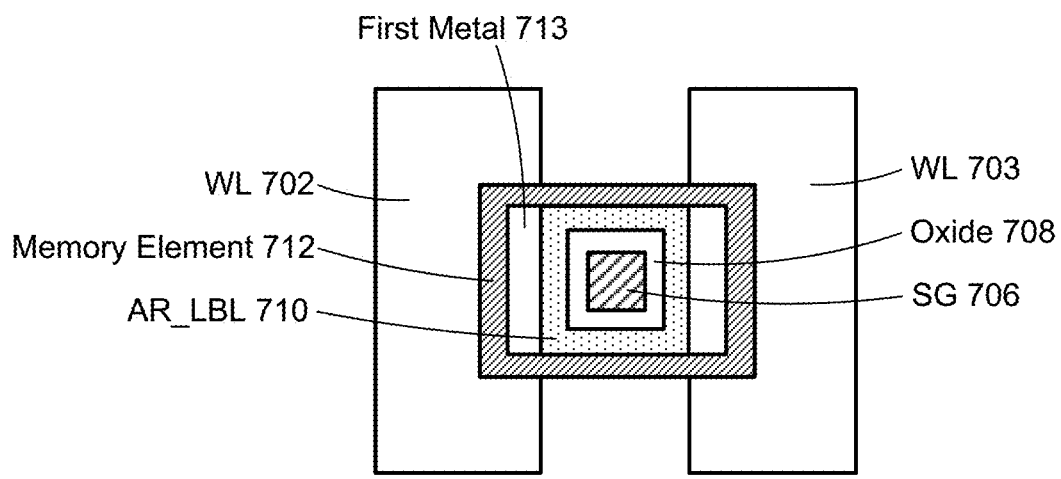

FIG. 6I depicts one embodiment of a top plan view of an adjustable resistance bit line structure similar to FIG. 6G, but with only a single metal layer between the word lines and the adjustable resistance local bit line. The adjustable resistance bit line structure may be formed using a vertical pillar that includes a select gate SG 706 that is surrounded by an oxide layer Oxide 708 that is surrounded by an adjustable resistance local bit line AR_LBL 710. A layer of first metal 713 may abut or directly connect the adjustable resistance local bit line AR_LBL 710. The memory element layer 712 may abut or directly connect the layer of first metal 713. A first side of the vertical pillar may contact a first word line WL 702 and a second side of the vertical pillar may contact a second word line WL 703. In some cases, the word line spacing between word line WL 702 and word line WL 703 may comprise 12 nm or 6 nm.

Figure 7A:
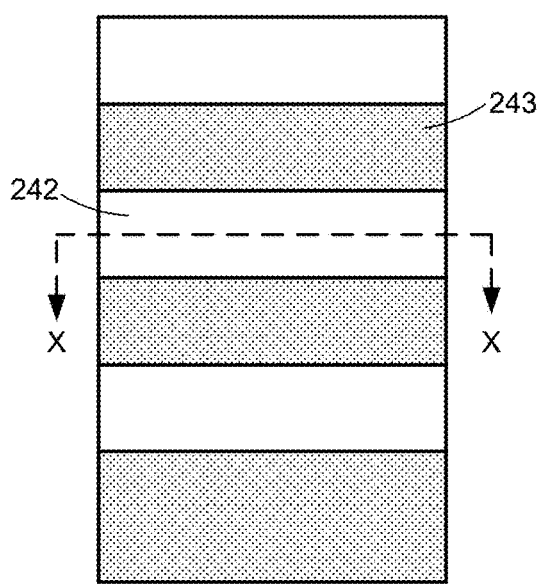
FIGS. 7A-7P depict various embodiments of cross-sectional views related to processes for fabricating portions of a memory array.
Figure 7C:
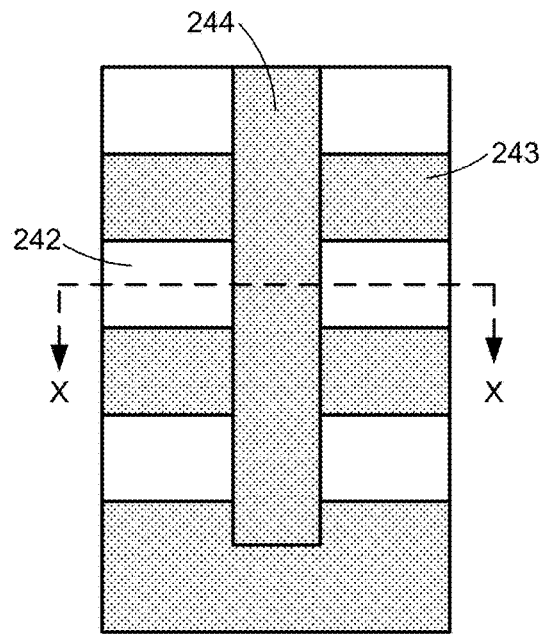
Figure 7B:
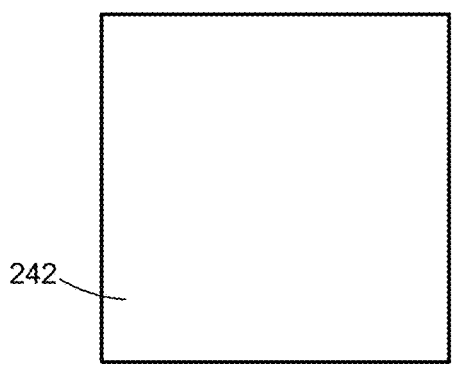
Figure 7D:
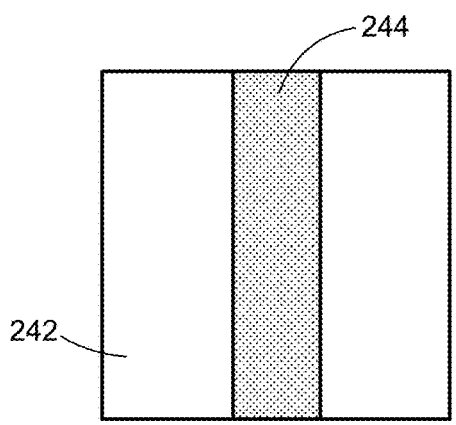
Figure 7E:
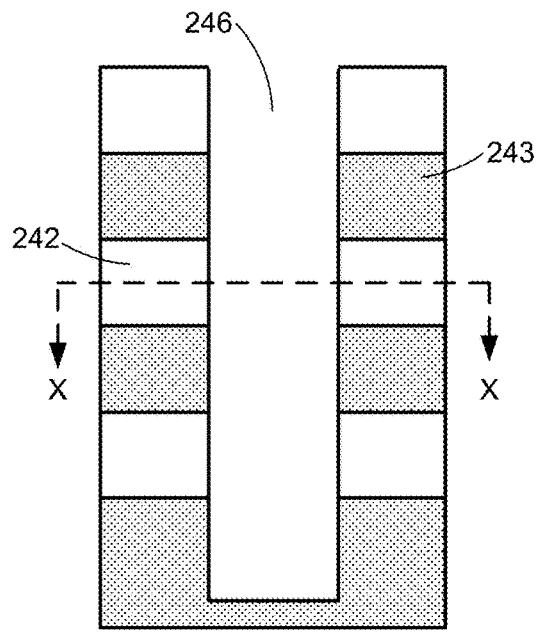
Figure 7G:
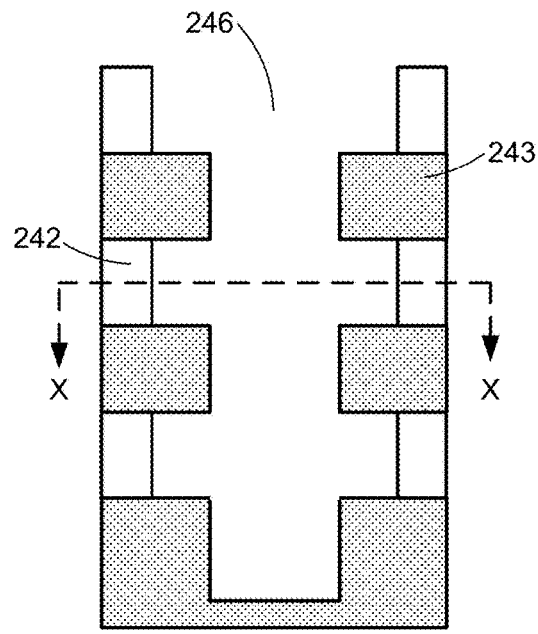
Figure 7F:
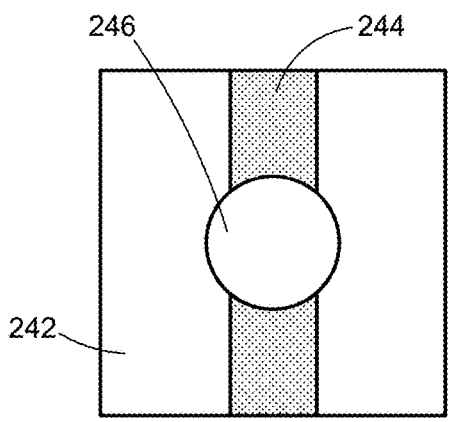
Figure 7H:
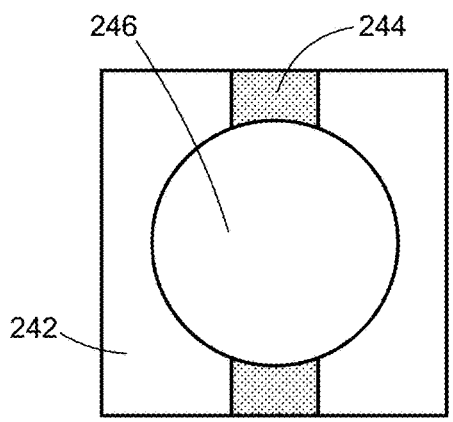
Figure 7M:
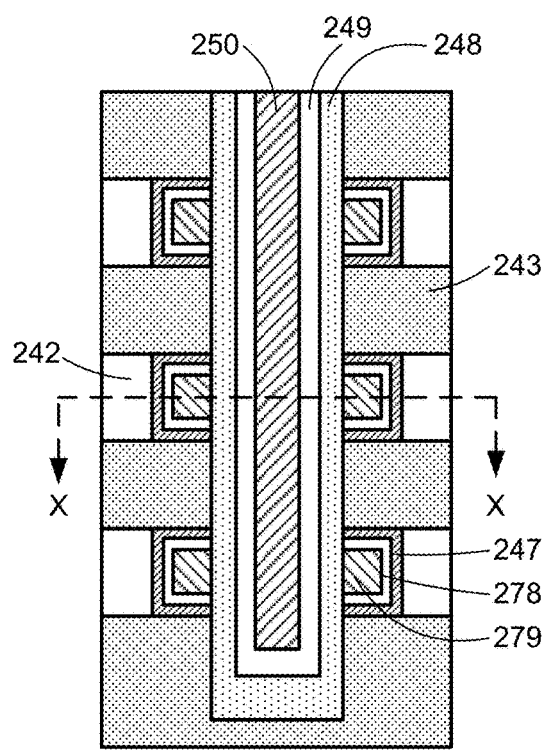
Figure 7O:
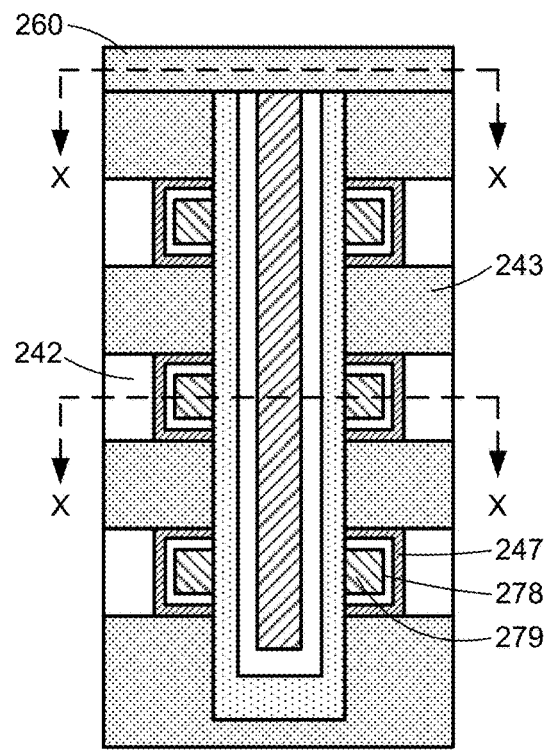
Figure 7N:
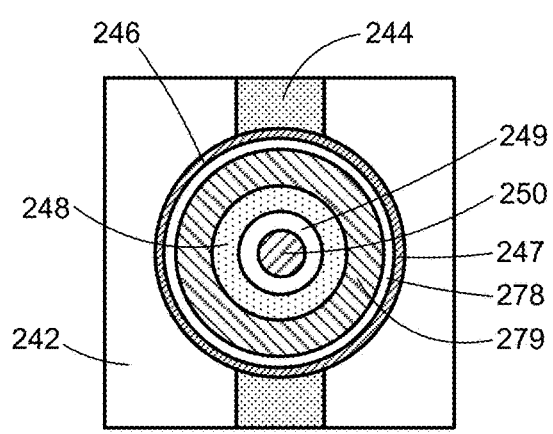
Figure 7P:
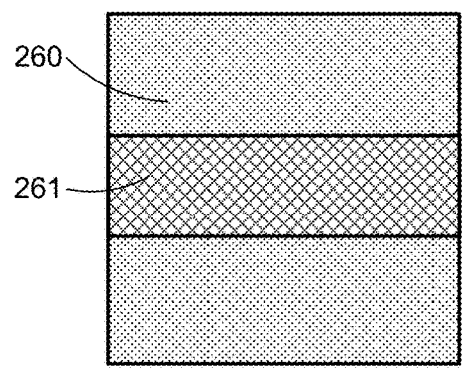

FIGS. 7A-7P depict various embodiments of cross-sectional views related to processes for fabricating a portion of a memory array that includes an adjustable resistance bit line structure. As depicted in FIGS. 7A-7B, an alternating stack of word line layers and dielectric layers, such as word line layer 242 and dielectric layer 243, have been formed over a substrate. FIG. 7B depicts one embodiment of a cross-sectional view taken along line X-X of FIG. 7A. The word line layer 242 may comprise TiN, polysilicon, or tungsten (W). The dielectric layer 243 may comprise an oxide layer. As depicted in FIGS. 7C-7D, a trench that was etched extending through a plurality of word line layers and dielectric layers has been filled with oxide in order to form an oxide partition 244 that extends through the plurality of word line layers and dielectric layers. FIG. 7D depicts one embodiment of a cross-sectional view taken along line X-X of FIG. 7C.

As depicted in FIGS. 7E-7F, a memory hole 246 has been etched extending through a plurality of word line layers and a plurality of dielectric layers. FIG. 7F depicts one embodiment of a cross-sectional view taken along line X-X of FIG. 7E. In some embodiments, a plurality of memory holes may be formed by etching through an alternating stack of word line layers and dielectric layers (e.g., etching through layers of TiN or polysilicon that are separated by oxide layers) to form the plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist.

As depicted in FIGS. 7G-7H, the word line layers have been recessed (e.g., using a wet etch) to create spaces in which MIM structures may be formed. FIG. 7H depicts one embodiment of a cross-sectional view taken along line X-X of FIG. 7G. In this case, the portions of the word line layers exposed on the inner walls of the memory hole 246 have been recessed.

As depicted in FIGS. 7I-7J, a memory element layer 247 (e.g., comprising a ReRAM material), a first layer of metal 278, and a second layer of metal 279 have been deposited within the recessed word line spaces. FIG. 7J depicts one embodiment of a cross-sectional view taken along line X-X of FIG. 7I.

In some embodiments, the memory element layer 247 may comprise a conformal layer of memory element material that is deposited within the memory hole 246 using various deposition techniques such as chemical vapor deposition (CVD), physical vapor deposition (PVD), or atomic layer deposition (ALD). The memory element layer 247 may comprise a phase change material, a ferroelectric material, or a metal oxide such as nickel oxide or hafnium oxide. In some cases, the memory element layer 247 may have a thickness (or width) of 2 nm to 4 nm. The first layer of metal 278 may comprise a conformal layer of metal (e.g., TiN) that is formed over the memory element layer 247. In some cases, the first layer of metal 278 may comprise TiN, WN, or TaN and may be deposited using ALD. The second layer of metal 279 may comprise a conformal layer of metal (e.g., tungsten) that is formed over the first layer of metal 278. In some cases, the second layer of metal 279 may comprise tungsten and may be deposited using CVD. The excess material may then be etched to form the structures depicted in FIGS. 7I-7J. A dry or wet etch may be used to remove the excess material.

In some embodiments, the first layer of metal 278 may correspond with a contacting electrode (e.g., for contacting the ReRAM material) and the second layer of metal 279 may correspond with a fill electrode (e.g., for filling and contacting the polysilicon channel). In some cases, instead of using two different metals for the contacting electrode and the fill electrode, only a single metal layer may be used (e.g., a layer of TiN). In another embodiment, the first layer of metal 278 may comprise Ni, Co, or Ti and a layer of doped polysilicon may be used as the fill electrode.

In some embodiments, an oxidation removal step or a native oxide removal step may be performed prior to depositing an intrinsic polysilicon layer or a layer of amorphous polysilicon within the memory hole 246. The oxidation removal may be performed using in-situ dry cleaning. In some embodiments, a surface nitridation step may be performed to improve adhesion and contact formation.

As depicted in FIGS. 7K-7L, an intrinsic polysilicon region 248 has been deposited within the memory hole 246. FIG. 7L depicts one embodiment of a cross-sectional view taken along line X-X of FIG. 7K. In one embodiment, the intrinsic polysilicon region 248 may comprise a conformal layer of intrinsic polysilicon that has been deposited within the memory hole 246. The conformal layer of intrinsic polysilicon may have a thickness (or width) of 10 nm to 20 nm. As depicted, a narrow hole 241 has been formed such that the intrinsic polysilicon region 248 surrounds the narrow hole 241 in two dimensions. In some cases, the intrinsic polysilicon region 248 may have a thickness (or width) of 7 nm to 20 nm.

As depicted in FIGS. 7M-7N, a dielectric layer 249 and a select gate region 250 have been formed within the narrow hole 241. FIG. 7N depicts one embodiment of a cross-sectional view taken along line X-X of FIG. 7M. In one embodiment, the dielectric layer 249 may comprise a conformal layer of silicon dioxide coating an inside surface of the intrinsic polysilicon region 248. In some embodiments, the dielectric layer 249 and the select gate region 250 may be formed within the narrow hole 241 by depositing the dielectric layer 249 and the select gate region 250 using various deposition techniques such as chemical vapor deposition (CVD), physical vapor deposition (PVD), or atomic layer deposition (ALD). The select gate region 250 may comprise TiN or polysilicon. The dielectric layer 249 may comprise an oxide, silicon dioxide, silicon nitride, or a high-k dielectric material. In some cases, the dielectric layer 249 may have a thickness (or width) of 5 nm to 10 nm.

Figure 8:
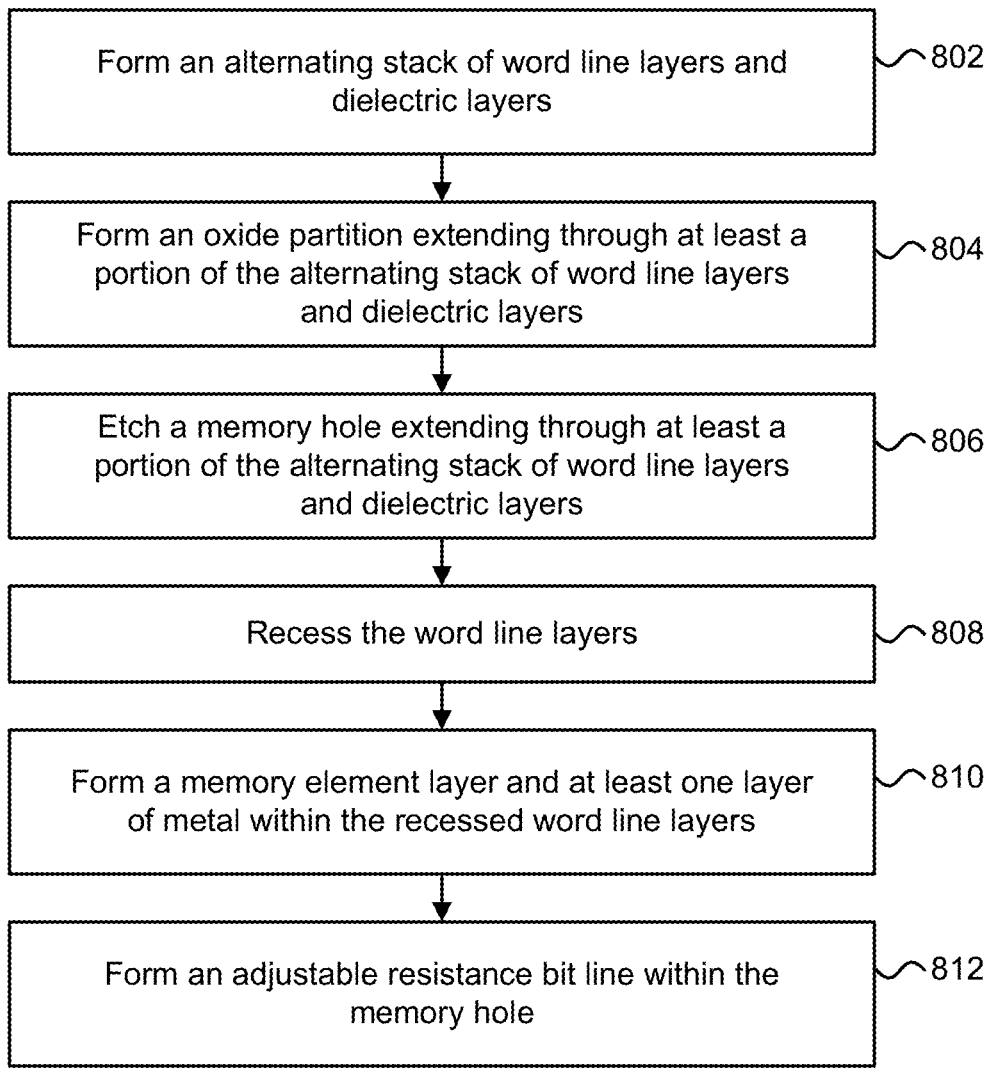
FIG. 8 is a flowchart describing one embodiment of a process for fabricating portions of a memory array.

FIG. 8 is a flowchart describing one embodiment of a process for fabricating portions of a memory array. The flowchart may omit common processing steps (e.g., the formation of isolation regions or structures, various implant and annealing steps, the formation of vias/contacts, the formation of a passivation layer, planarization, etc.) in order to highlight the processing steps described.

In step 802, an alternating stack of word line layers and dielectric layers is formed. One example of an alternating stack of word line layers and dielectric layers is depicted in FIGS. 7A-7B. The word line layers may comprise TiN or tungsten (W). The dielectric layers may comprise an oxide layer or silicon dioxide. In step 804, an oxide partition extending through at least a portion of the alternating stack of word line layers and dielectric layers is formed. One example of an oxide partition is depicted in FIGS. 7C-7D. In step 806, a memory hole extending through at least a portion of the alternating stack of word line layers and dielectric layers is etched. One example of a memory hole is depicted in FIGS. 7E-7F. In some embodiments, a plurality of memory holes may be formed by etching through an alternating stack of word line layers and dielectric layers (e.g., etching through layers of TiN or polysilicon that are separated by oxide layers) to form the plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE).

In step 808, the word line layers or a subset of the word line layers are recessed (e.g., using a wet etch). One example of recessed word lines is depicted in FIGS. 7G-7H. In step 810, a memory element layer and at least one layer of metal are formed within the recessed word line layers. One example of a memory element layer and at least one layer of metal being formed within recessed word line layers is depicted in FIGS. 7I-7J. In some cases, one or more different metals may be deposited within the recessed word line layers. In one example, a ReRAM material layer may be deposited followed by a layer of TiN deposited on the ReRAM material layer. A layer of tungsten may be deposited on the layer of TiN. In some embodiments, the memory element layer may comprise a conformal layer of memory element material that is deposited within the memory hole using various deposition techniques such as chemical vapor deposition (CVD), physical vapor deposition (PVD), or atomic layer deposition (ALD). The memory element layer may comprise a phase change material, a ferroelectric material, or a metal oxide such as nickel oxide or hafnium oxide.

In step 812, an adjustable resistance bit line is formed within the memory hole. The adjustable resistance bit line may be formed by depositing an intrinsic polysilicon region into the memory hole, followed by a dielectric layer and a select gate region. One example of an adjustable resistance bit line is depicted in FIGS. 7M-7N. In one embodiment, the dielectric layer may comprise a conformal layer of silicon dioxide coating an inside surface of the intrinsic polysilicon region. In some embodiments, the dielectric layer and the select gate region may be formed by depositing the dielectric layer and the select gate region using various deposition techniques such as chemical vapor deposition (CVD), physical vapor deposition (PVD), or atomic layer deposition (ALD). The select gate region may comprise TiN or polysilicon. The dielectric layer may comprise an oxide, silicon dioxide, silicon nitride, or a high-k dielectric material. In some cases, the dielectric layer may have a thickness (or width) of 5 nm to 10 nm.

Some embodiments of the disclosed technology include systems and methods for reducing the number of unselected memory cells (e.g., H-cells or U-cells) or the amount of leakage current through unselected memory cells during read and/or write operations using an intrinsic vertical bit line architecture (iVBL). The iVBL architecture may improve memory performance and provide low current operation for a non-volatile memory array, such as a ReRAM array. In some cases, the iVBL architecture may eliminate or significantly reduce the leakage currents through H-cells by making unselected vertical bit lines connected to the H-cells highly resistive (e.g., more than 1 Gohm) or non-conducting and making selected vertical bit lines low resistance (e.g., less than 1 Kohm) or conducting (e.g., only a selected vertical bit line connected to a selected memory cell may be made conductive, while all other vertical bit lines may be made non-conductive).

One embodiment of the disclosed technology includes a first word line, an adjustable resistance bit line structure including an adjustable resistance local bit line and a select gate, and a first memory element arranged between the first word line and a first layer of metal. The first layer of metal is arranged between the first memory element and the adjustable resistance local bit line. The adjustable resistance bit line structure configured to set a resistance of the adjustable resistance local bit line based on a first voltage applied to the select gate.

One embodiment of the disclosed technology includes forming an alternating stack of word line layers and dielectric layers, etching a memory hole extending through at least a portion of the alternating stack of word line layers and dielectric layers, recessing at least a subset of the word line layers, forming a memory element layer and at least one layer of metal within the recessed word line layers, and forming an adjustable resistance bit line structure within the memory hole.

One embodiment of the disclosed technology includes a word line, a bit line structure including a layer of intrinsic polysilicon and a select gate, and a memory element directly connected to the word line and a layer of metal. The layer of metal is arranged between the memory element and the layer of intrinsic polysilicon. The bit line structure configured to set a resistance of the layer of intrinsic polysilicon based on a voltage applied to the select gate.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A non-volatile storage system, comprising:
    a first word line;
    an adjustable resistance bit line structure including an adjustable resistance local bit line and a select gate that is electrically isolated from the adjustable resistance local bit line by a dielectric layer; and
    a first memory element arranged between the first word line and a first layer of metal in a first dimension, the first layer of metal is arranged between the first memory element and a second layer of metal different from the first layer of metal in the first dimension, the second layer of metal is arranged between the first layer of metal and the adjustable resistance local bit line in the first dimension, the adjustable resistance bit line structure configured to adjust a resistance of the adjustable resistance local bit line from a high off-resistance to a low on-resistance based on a first voltage applied to the select gate.

2. The non-volatile storage system of claim 1, wherein:
    the first layer of metal comprises one of a metal, a metal-nitride, or a metal-silicide.

3. The non-volatile storage system of claim 1, wherein:
    the first layer of metal comprises TiN.

4. The non-volatile storage system of claim 1, wherein:
    the second layer of metal comprises tungsten.

5. The non-volatile storage system of claim 1, wherein:
    the first memory element directly abuts the first layer of metal, the first layer of metal directly abuts the second layer of metal, the second layer of metal directly abuts the adjustable resistance local bit line.

6. The non-volatile storage system of claim 1, wherein:
    the adjustable resistance bit line structure is configured to set the adjustable resistance local bit line into either a conducting state or a non-conducting state based on the first voltage applied to the select gate.

7. The non-volatile storage system of claim 1, wherein:
    the adjustable resistance local bit line comprises undoped polysilicon.

8. The non-volatile storage system of claim 1, wherein:
the adjustable resistance bit line structure includes the dielectric layer arranged between the select gate and the adjustable resistance local bit line in the first dimension.

9. The non-volatile storage system of claim 1, wherein:
the first memory element includes a resistive random-access memory material.

10. The non-volatile storage system of claim 1, wherein:
the first memory element is part of a memory array, the memory array comprises a three-dimensional memory array.

11. The non-volatile storage system of claim 1, wherein:
the first memory element is part of a memory array, the memory array comprises a non-volatile memory that is monolithically formed in one or more physical levels of memory cells having active areas disposed above a silicon substrate.

12. A non-volatile memory, comprising:
a word line;
a bit line structure including a layer of intrinsic polysilicon and a select gate that is electrically isolated from the layer of intrinsic polysilicon by a dielectric layer; and
a memory element directly connected to the word line and directly connected to a layer of metal, the memory element arranged between the word line and the layer of metal in a first dimension, the layer of metal is arranged between the memory element and a second layer of metal different from the layer of metal in the first dimension, the second layer of metal is arranged between the layer of metal and the layer of intrinsic polysilicon in the first dimension, the bit line structure configured to adjust a resistance of the layer of intrinsic polysilicon from a high off-resistance to a low on-resistance based on a voltage applied to the select gate.

13. The non-volatile memory of claim 12, wherein:
the layer of metal comprises one of a metal, a metal-nitride, or a metal-silicide.

14. The non-volatile memory of claim 12, wherein:
the second layer of metal comprises tungsten.

15. The non-volatile memory of claim 12, wherein:
the memory element directly abuts the layer of metal, the layer of metal directly abuts the second layer of metal, the second layer of metal directly abuts the layer of intrinsic polysilicon.

16. The non-volatile memory of claim 12, wherein:
the layer of metal comprises titanium nitride; and
the memory element includes a resistive random-access memory material.

17. The non-volatile memory of claim 12, wherein:
the bit line structure includes the dielectric layer arranged between the select gate and the layer of intrinsic polysilicon in the first dimension; and
the bit line structure configured to set the layer of intrinsic polysilicon into either a conducting state or a non-conducting state based on the voltage applied to the select gate.

* * * * *